(12) United States Patent
Yamazaki et al.

(10) Patent No.: US 9,530,872 B2
(45) Date of Patent: Dec. 27, 2016

(54) SEMICONDUCTOR ELEMENT AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Junichiro Sakata, Atsugi (JP); Akiharu Miyanaga, Hadano (JP); Masayuki Sakakura, Tochigi (JP); Junichi Koezuka, Atsugi (JP); Tetsunori Maruyama, Atsugi (JP); Yuki Imoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/146,093

(22) Filed: Jan. 2, 2014

(65) Prior Publication Data
US 2014/0113407 A1    Apr. 24, 2014

Related U.S. Application Data

(63) Continuation of application No. 12/888,835, filed on Sep. 23, 2010, now Pat. No. 8,859,351.

(30) Foreign Application Priority Data

Sep. 24, 2009   (JP) .................................. 2009-219558

(51) Int. Cl.
*H01L 29/66*   (2006.01)
*H01L 21/02*   (2006.01)
(Continued)

(52) U.S. Cl.
CPC ... *H01L 29/66969* (2013.01); *H01L 21/02565* (2013.01); *H01L 27/1225* (2013.01); *H01L 29/7869* (2013.01)

(58) Field of Classification Search
CPC .......... H01L 21/02565; H01L 27/1225; H01L 29/66969; H01L 29/7869
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101258607 A | 9/2008 |
| CN | 101506986 A | 8/2009 |

(Continued)

OTHER PUBLICATIONS

International Search Report (Application No. PCT/JP2010/065363) dated Nov. 30, 2010.
(Continued)

*Primary Examiner* — Latanya N Crawford
(74) *Attorney, Agent, or Firm* — Robinson Intellectual Property Law Office; Eric J. Robinson

(57) ABSTRACT

An object is to provide a thin film transistor and a method for manufacturing the thin film transistor including an oxide semiconductor with a controlled threshold voltage, high operation speed, a relatively easy manufacturing process, and sufficient reliability. An impurity having influence on carrier concentration in the oxide semiconductor layer, such as a hydrogen atom or a compound containing a hydrogen atom such as $H_2O$, may be eliminated. An oxide insulating layer containing a large number of defects such as dangling bonds may be formed in contact with the oxide semicon-
(Continued)

ductor layer, such that the impurity diffuses into the oxide insulating layer and the impurity concentration in the oxide semiconductor layer is reduced. The oxide semiconductor layer or the oxide insulating layer in contact with the oxide semiconductor layer may be formed in a deposition chamber which is evacuated with use of a cryopump whereby the impurity concentration is reduced.

15 Claims, 6 Drawing Sheets

(51) Int. Cl.
  *H01L 27/12* (2006.01)
  *H01L 29/786* (2006.01)
(58) Field of Classification Search
  USPC .......................................................... 438/104
  See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,833,845 B2 | 11/2010 | Yamazaki et al. | |
| 7,935,582 B2 | 5/2011 | Iwasaki | |
| 7,956,361 B2 | 6/2011 | Iwasaki | |
| 8,110,436 B2 | 2/2012 | Hayashi et al. | |
| 8,148,245 B2 * | 4/2012 | Ikisawa ................ C04B 35/453 204/298.13 | |
| 8,154,024 B2 | 4/2012 | Iwasaki | |
| 8,164,256 B2 | 4/2012 | Sano et al. | |
| 8,263,421 B2 | 9/2012 | Yamazaki et al. | |
| 8,304,779 B2 | 11/2012 | Yamazaki et al. | |
| 8,384,077 B2 | 2/2013 | Yano et al. | |
| 8,415,198 B2 | 4/2013 | Itagaki et al. | |
| 8,445,903 B2 | 5/2013 | Inoue et al. | |
| 8,461,583 B2 | 6/2013 | Yano et al. | |
| 8,541,944 B2 | 9/2013 | Sano et al. | |
| 8,563,977 B2 | 10/2013 | Shimada et al. | |
| 8,748,879 B2 * | 6/2014 | Yano et al. ...................... 257/43 | |
| 8,785,240 B2 * | 7/2014 | Watanabe ...................... 438/104 | |
| 8,993,386 B2 | 3/2015 | Ohara et al. | |
| 2001/0046027 A1 | 11/2001 | Tai et al. | |
| 2002/0020839 A1 | 2/2002 | Yamazaki et al. | |
| 2002/0056838 A1 | 5/2002 | Ogawa | |
| 2002/0132454 A1 | 9/2002 | Ohtsu et al. | |
| 2003/0047785 A1 | 3/2003 | Kawasaki et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 * | 5/2006 | Yabuta et al. ................ 438/151 |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0272370 A1 * | 11/2008 | Endo et al. ...................... 257/43 |
| 2008/0296568 A1 | 12/2008 | Ryu et al. | |
| 2008/0299702 A1 | 12/2008 | Son et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0166616 A1 | 7/2009 | Uchiyama | |
| 2009/0278122 A1 | 11/2009 | Hosono et al. | |
| 2009/0280600 A1 | 11/2009 | Hosono et al. | |
| 2009/0325341 A1 | 12/2009 | Itagaki et al. | |
| 2010/0032665 A1 * | 2/2010 | Yamazaki et al. .............. 257/43 |
| 2010/0045179 A1 | 2/2010 | Sano et al. | |
| 2010/0051938 A1 * | 3/2010 | Hayashi et al. ................ 257/43 |
| 2010/0051940 A1 | 3/2010 | Yamazaki et al. | |
| 2010/0051949 A1 | 3/2010 | Yamazaki et al. | |
| 2010/0065844 A1 | 3/2010 | Tokunaga | |
| 2010/0084648 A1 | 4/2010 | Watanabe | |
| 2010/0092800 A1 | 4/2010 | Itagaki et al. | |
| 2010/0102312 A1 * | 4/2010 | Yamazaki et al. .............. 257/43 |
| 2010/0109002 A1 | 5/2010 | Itagaki et al. | |
| 2010/0163876 A1 * | 7/2010 | Inoue et al. ...................... 257/59 |
| 2010/0213459 A1 | 8/2010 | Shimada et al. | |

(56) References Cited

U.S. PATENT DOCUMENTS

| | | |
|---|---|---|
| 2010/0276689 A1 | 11/2010 | Iwasaki |
| 2010/0279462 A1 | 11/2010 | Iwasaki |
| 2010/0283049 A1* | 11/2010 | Sato et al. ............... 257/43 |
| 2010/0285632 A1* | 11/2010 | Inoue et al. ............. 438/104 |
| 2011/0058116 A1 | 3/2011 | Yamazaki et al. |
| 2011/0070693 A1 | 3/2011 | Yamazaki et al. |
| 2011/0227060 A1* | 9/2011 | Miyanaga et al. .......... 257/43 |
| 2012/0132911 A1 | 5/2012 | Shimada et al. |
| 2013/0140175 A1 | 6/2013 | Yano et al. |
| 2013/0146452 A1 | 6/2013 | Yano et al. |
| 2014/0367682 A1 | 12/2014 | Yamazaki et al. |

FOREIGN PATENT DOCUMENTS

| | | | |
|---|---|---|---|
| EP | 1 737 044 A | 12/2006 | |
| EP | 1 770 788 | 4/2007 | |
| EP | 1 995 787 | 11/2008 | |
| EP | 1 998 373 | 12/2008 | |
| EP | 1 998 374 | 12/2008 | |
| EP | 1 998 375 | 12/2008 | |
| EP | 2 226 847 A | 9/2010 | |
| EP | 2339639 A | 6/2011 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2004-288864 A | 10/2004 | |
| JP | 2007-073563 A | 3/2007 | |
| JP | 2007-073698 A | 3/2007 | |
| JP | 2007-073705 A | 3/2007 | |
| JP | 2007-096055 | 4/2007 | |
| JP | 2007-103918 A | 4/2007 | |
| JP | 2007-123861 | 5/2007 | |
| JP | 2007-158304 A | 6/2007 | |
| JP | 2007-173489 A | 7/2007 | |
| JP | 2007-194594 A | 8/2007 | |
| JP | 2008-053356 A | 3/2008 | |
| JP | 2008-141119 A | 6/2008 | |
| JP | 2008-281988 A | 11/2008 | |
| JP | 2008-311342 A | 12/2008 | |
| JP | 2008-311342 A | 12/2008 | |
| JP | 2009-099944 A | 5/2009 | |
| JP | 2009-099953 A | 5/2009 | |
| JP | 2009-135436 A | 6/2009 | |
| JP | 2009-141002 A | 6/2009 | |
| JP | 2009-158663 A | 7/2009 | |
| JP | 2009-164519 A | 7/2009 | |
| JP | WO 2009084537 A1 * | 7/2009 | ........... C04B 35/453 |
| JP | 2009-224479 A | 10/2009 | |
| JP | 2010-062229 A | 3/2010 | |
| KR | 2009-0018587 A | 2/2009 | |
| WO | WO 2004/114391 | 12/2004 | |
| WO | WO 2007/029844 | 3/2007 | |
| WO | WO 2008/023553 | 2/2008 | |
| WO | WO 2008/069286 A3 | 6/2008 | |
| WO | WO-2008/126879 | 10/2008 | |
| WO | WO 2008136505 A1 * | 11/2008 | ........... H01L 29/786 |
| WO | WO-2009/041544 | 4/2009 | |
| WO | WO 2009/041713 | 4/2009 | |
| WO | WO 2009/072532 | 6/2009 | |
| WO | WO-2009/075281 | 6/2009 | |
| WO | WO 2009/081885 | 7/2009 | |
| WO | WO 2009/084537 | 7/2009 | |

OTHER PUBLICATIONS

Written Opinion (Application No. PCT/JP2010/065363) dated Nov. 30, 2010.

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters) , Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ (M=In, Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

(56) References Cited

OTHER PUBLICATIONS

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4:Excellent Performance of Indium-Oxide-Based Thin-Film Transistors by DC Sputtering," SID Digest '09 : SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn-Oxide TFTs," IDW '09: Proceedings of the $16^{th}$ International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by Peald Grown ZnO TFT," IMID '07 Digest, 2007, pp. 1249-1252.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44

Osada et al., "Development of Driver-Integrated Panel using Amorphous In—Ga—Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the $13^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest

(56) References Cited

OTHER PUBLICATIONS

'08: SID International Symposium Digest of Technical Papers, May 20, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Chinese Office Action (Application No. 201080043261.1) Dated May 5, 2014.

Taiwanese Office Action (Application No. 099132252) Dated Jul. 15, 2015.

Korean Office Action (Application No. 2012-7006049) Dated Aug. 29, 2016.

\* cited by examiner

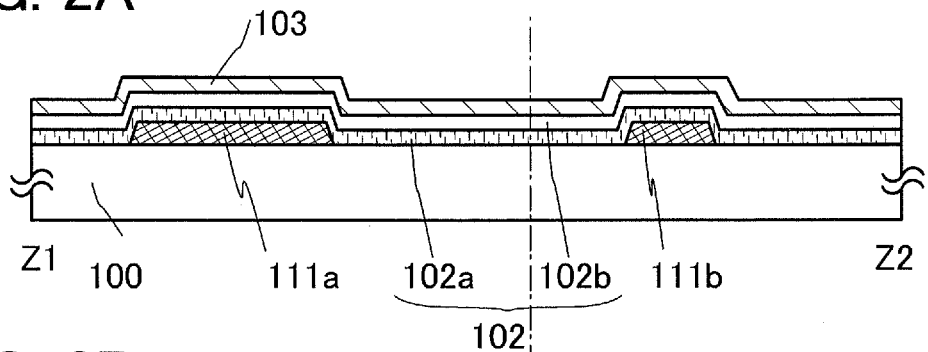
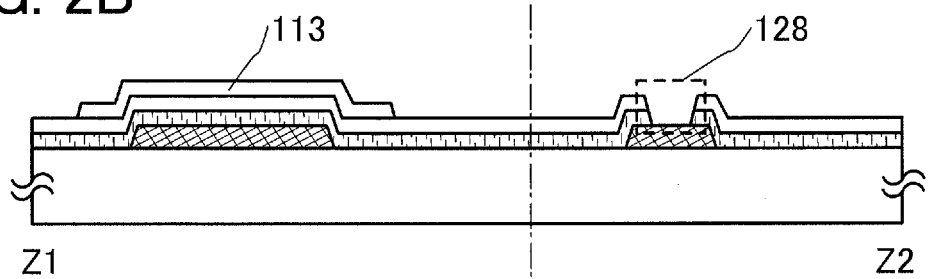
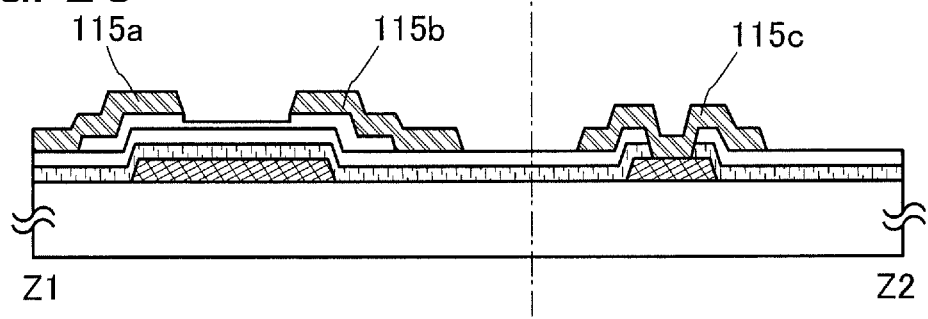
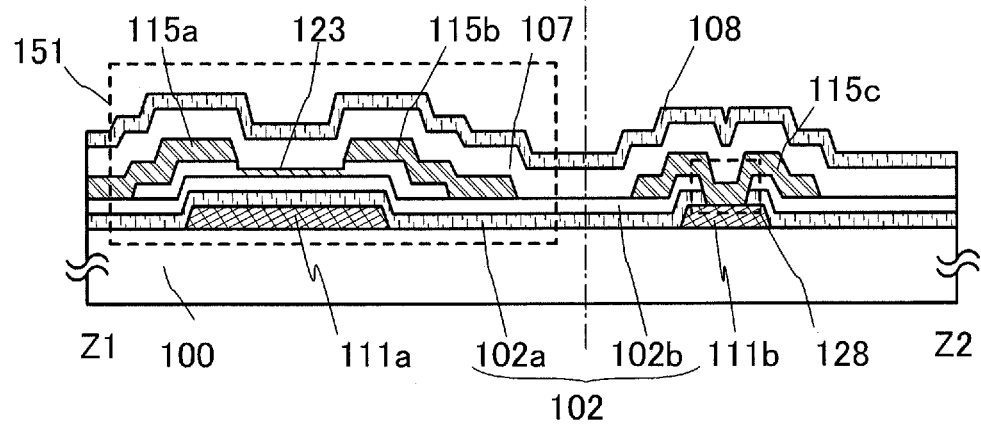

SEMICONDUCTOR ELEMENT AND METHOD FOR MANUFACTURING THE SAME

TECHNICAL FIELD

The present invention relates to semiconductor elements and methods for manufacturing the semiconductor elements. Specifically, the present invention relates to semiconductor elements each including an oxide semiconductor and manufacturing methods thereof.

BACKGROUND ART

A thin film transistor (TFT) formed over a flat plate such as a glass substrate, which is typically used in a liquid crystal display device, is generally formed using a semiconductor material such as amorphous silicon or polycrystalline silicon. TFTs using amorphous silicon have low electric field mobility, but can respond to increase in size of glass substrates. On the other hand, TFTs using polycrystalline silicon have high electric field mobility, but need a crystallization step such as laser annealing and are not always adaptable to increase in size of glass substrates.

In contrast, a technique in which a TFT is formed using an oxide semiconductor as a semiconductor material and applied to an electronic device or an optical device has attracted attention. For example, Patent Documents 1 and 2 each disclose a technique in which a TFT is formed using zinc oxide or an In—Ga—Zn—O-based oxide semiconductor as a semiconductor material and used for a switching element or the like in an image display device.

A TFT in which a channel formation region (also referred to as a channel region) is provided in an oxide semiconductor can have higher electric field mobility than a TFT using amorphous silicon. An oxide semiconductor layer can be formed at a temperature of 300° C. or lower by a sputtering method or the like, and a manufacturing process of the TFT using an oxide semiconductor layer is simpler than that of the TFT using polycrystalline silicon.

TFTs which are formed using such an oxide semiconductor over a glass substrate, a plastic substrate, or the like are expected to be applied to display devices such as a liquid crystal display, an electroluminescent display (also referred to as an EL display), and electronic paper.

REFERENCE

Patent Document

[Patent Document 1] Japanese Published Patent Application No. 2007-123861
[Patent Document 2] Japanese Published Patent Application No. 2007-096055

DISCLOSURE OF INVENTION

However, a semiconductor element including an oxide semiconductor has not had excellent properties. For example, a controlled threshold voltage, high operation speed, a relatively easy manufacturing process, and sufficient reliability are required for a thin film transistor including an oxide semiconductor layer. The present invention is made in view of the foregoing technical background.

Therefore, an object of one embodiment of the present invention is to increase reliability of a semiconductor element including an oxide semiconductor layer. Specifically, an object is to provide a thin film transistor including an oxide semiconductor with a controlled threshold voltage. Another object is to provide a thin film transistor including an oxide semiconductor with high operation speed, a relatively easy manufacturing process, and sufficient reliability.

Another object is to provide a method for manufacturing a thin film transistor including an oxide semiconductor with a controlled threshold voltage, high operation speed, a relatively easy manufacturing process, and sufficient reliability.

The concentration of carriers in an oxide semiconductor layer has influence on the threshold voltage of a thin film transistor including the oxide semiconductor. The carriers in the oxide semiconductor layer are generated due to an impurity contained in the oxide semiconductor layer. For example, a hydrogen atom, a compound containing a hydrogen atom such as $H_2O$, or a compound containing a carbon atom which is contained in the oxide semiconductor layer formed causes an increase in the carrier concentration in the oxide semiconductor layer.

As a result, it is difficult to control the threshold voltage of a thin film transistor including an oxide semiconductor layer containing a hydrogen atom, a compound containing a hydrogen atom such as $H_2O$, or a compound containing a carbon atom.

In order to achieve the above objects, an impurity having influence on the concentration of carriers contained in the oxide semiconductor layer, e.g., a hydrogen atom, a compound containing a hydrogen atom such as $H_2O$, or a compound containing a carbon atom, may be eliminated. Specifically, hydrogen concentration in the oxide semiconductor layer included in a semiconductor element may be $1 \times 10^{18}$ $cm^{-3}$ to $2 \times 10^{20}$ $cm^{-3}$ inclusive.

In addition, an oxide insulating layer containing a large number of defects such as dangling bonds may be formed in contact with the oxide semiconductor layer so that a hydrogen atom or a compound containing a hydrogen atom such as $H_2O$ contained in the oxide semiconductor layer can diffuse into the oxide insulating layer and the impurity concentration in the oxide semiconductor layer can be reduced.

Further, the oxide semiconductor layer or the oxide insulating layer in contact with the oxide semiconductor layer may be formed in a deposition chamber in which the impurity concentration is reduced by evacuation with use of a cryopump.

That is, one embodiment of the present invention is a method for manufacturing an oxide semiconductor element including the steps of forming a gate electrode over a substrate, forming a gate insulating film over the gate electrode, forming an oxide semiconductor layer over the gate electrode with the gate insulating film therebetween, forming a source electrode and a drain electrode in a manner that the source electrode and the drain electrode are in contact with the oxide semiconductor layer and end portions of the source electrode and the drain electrode overlap with the gate electrode, and forming an oxide insulating layer covering the oxide semiconductor layer between the source electrode and the drain electrode. Note that the substrate is held in a reaction chamber kept in a reduced pressure state, the substrate is heated to a temperature lower than 600° C., and in the state where moisture remaining in the reaction chamber is removed, the gate insulating film is formed over the substrate by introducing a sputtering gas from which hydrogen and moisture are removed and using a target provided in the reaction chamber. In the above method for manufacturing the oxide semiconductor element, the oxide semiconductor layer is formed over the gate insulating film by using a metal oxide provided in the reaction chamber as a target.

In the method for manufacturing the oxide semiconductor element, another embodiment of the present invention is a method for manufacturing an oxide semiconductor element in which the purity of a sputtering gas used in deposition of an oxide semiconductor layer is 99.9999% or higher.

In the method for manufacturing the oxide semiconductor element, another embodiment of the present invention is a method for manufacturing an oxide semiconductor element in which remaining moisture is removed by evacuation with use of a cryopump.

In the method for manufacturing the oxide semiconductor element, another embodiment of the present invention is a method for manufacturing an oxide semiconductor element in which the metal oxide target is a metal oxide containing zinc oxide as a main component.

In the method for manufacturing the oxide semiconductor element, another embodiment of the present invention is a method for manufacturing an oxide semiconductor element in which the metal oxide target is a metal oxide containing indium, gallium, and zinc.

Another embodiment of the present invention is a method for manufacturing an oxide semiconductor element including the steps of forming a gate electrode over a substrate, forming a gate insulating film over the gate electrode, forming an oxide semiconductor layer over the gate electrode with the gate insulating film therebetween, forming a source electrode and a drain electrode in a manner that the source electrode and the drain electrode are in contact with the oxide semiconductor layer and end portions of the source electrode and the drain electrode overlap with the gate electrode, and forming an oxide insulating layer covering the oxide semiconductor layer between the source electrode and the drain electrode. Note that the substrate over which the gate insulating film is formed is held in a heat chamber kept in a reduced pressure state, the substrate is preheated to a temperature lower than 400° C. in the state where moisture remaining in the heat chamber is removed, the substrate is held in a reaction chamber kept in a reduced pressure state, the substrate is heated to a temperature lower than 600° C., and the oxide semiconductor layer is formed over the gate insulating film by using a metal oxide provided in the reaction chamber as a target.

In the method for manufacturing the oxide semiconductor element, another embodiment of the present invention is a method for manufacturing an oxide semiconductor element in which remaining moisture is removed by evacuation with use of a cryopump.

In the method for manufacturing the oxide semiconductor element, another embodiment of the present invention is a method for manufacturing an oxide semiconductor element in which the metal oxide target is a metal oxide containing zinc oxide as a main component.

In the method for manufacturing the oxide semiconductor element, another embodiment of the present invention is a method for manufacturing an oxide semiconductor element in which the metal oxide target is a metal oxide containing indium, gallium, and zinc.

Another embodiment of the present invention is a thin film transistor including a gate electrode over a substrate, a gate insulating film over the gate electrode, an oxide semiconductor layer over the gate electrode with the gate insulating film therebetween, a source electrode and a drain electrode formed in a manner that the source electrode and the drain electrode are in contact with the oxide semiconductor layer and end portions of the source electrode and the drain electrode overlap with the gate electrode, and an oxide insulating layer covering the oxide semiconductor layer formed between the source electrode and the drain electrode. Note that in the above thin film transistor, hydrogen concentration at the interface between the oxide semiconductor layer and the oxide insulating layer is more than or equal to $5 \times 10^{19}$ cm$^{-3}$ and less than or equal to $1 \times 10^{22}$ cm$^{-3}$.

Another embodiment of the present invention is a thin film transistor including a gate electrode over a substrate, a gate insulating film over the gate electrode, an oxide semiconductor layer over the gate electrode with the gate insulating film therebetween, a source electrode and a drain electrode which are formed in a manner that the source electrode and the drain electrode are in contact with the oxide semiconductor layer and end portions of the source electrode and the drain electrode overlap with the gate electrode, and an oxide insulating layer covering the oxide semiconductor layer formed between the source electrode and the drain electrode. Note that in the above thin film transistor, hydrogen concentration at the interface between the oxide semiconductor layer and the oxide insulating layer is more than or equal to 5 times and less than or equal to 100 times as high as hydrogen concentration in a portion of the oxide insulating layer apart from the interface by 30 nm.

Another embodiment of the present invention is a thin film transistor including a gate electrode over a substrate, a gate insulating film over the gate electrode, an oxide semiconductor layer over the gate electrode with the gate insulating film therebetween, a source electrode and a drain electrode formed in a manner that the source electrode and the drain electrode are in contact with the oxide semiconductor layer and end portions of the source electrode and the drain electrode overlap with the gate electrode, and an oxide insulating layer covering the oxide semiconductor layer formed between the source electrode and the drain electrode. Note that in the above thin film transistor, hydrogen concentration in the oxide semiconductor layer is more than or equal to $1 \times 10^{18}$ cm$^{-3}$ and less than or equal to $2 \times 10^{20}$ cm$^{-3}$.

Note that the expression "B is formed on A" or "B is formed over A" in this specification does not necessarily mean that B is formed in direct contact with A. The expression includes the case where A and B are not in direct contact with each other, i.e., the case where another object is interposed between A and B. Here, both A and B correspond to an object (e.g., a device, an element, a circuit, a wiring, an electrode, a terminal, a film, or a layer).

Therefore, for example, when "Layer B is formed on Layer A" or "Layer B is formed over Layer A" is expressed, the expression includes both the case where Layer B is formed in direct contact with Layer A, and the case where another layer (e.g., Layer C or Layer D) is formed in direct contact with Layer A, and Layer B is formed in direct contact with Layer C or Layer D. Note that another layer (e.g., Layer C or Layer D) may be a single layer or a plurality of layers.

In this specification, the term "successive deposition" means a process which is carried out as follows: a substrate to be processed is placed in an atmosphere which is controlled to be vacuum or an inert gas atmosphere (a nitrogen atmosphere or a rare gas atmosphere) at all times without being exposed to a contaminant atmosphere such as air during a process from a first deposition step to a second deposition step. By the successive deposition, a film can be formed while moisture or the like is prevented from attaching again to the substrate to be processed which is cleaned.

Note that in this specification, a light-emitting device refers to an image display unit, a light-emitting unit, or a light source (including a lighting device). In addition, the light-emitting device includes the following modules in its category: a module in which a connector such as an flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a substrate over which a light-emitting element is formed by a chip on glass (COG) method.

With the present invention, a highly reliable semiconductor element including an oxide semiconductor layer can be provided. Specifically, a thin film transistor including an oxide semiconductor with a controlled threshold voltage can be provided. In addition, a thin film transistor including an oxide semiconductor with high operation speed, a relatively easy manufacturing process, and sufficient reliability can be provided.

In addition, a method for manufacturing a thin film transistor including an oxide semiconductor with a controlled threshold voltage, high operation speed, a relatively easy manufacturing process, and sufficient reliability can be provided.

BRIEF DESCRIPTION OF DRAWINGS

FIGS. 2A to 2D illustrate a manufacturing process of a semiconductor element according to an embodiment.

BEST MODE FOR CARRYING OUT THE INVENTION

Figure 1:
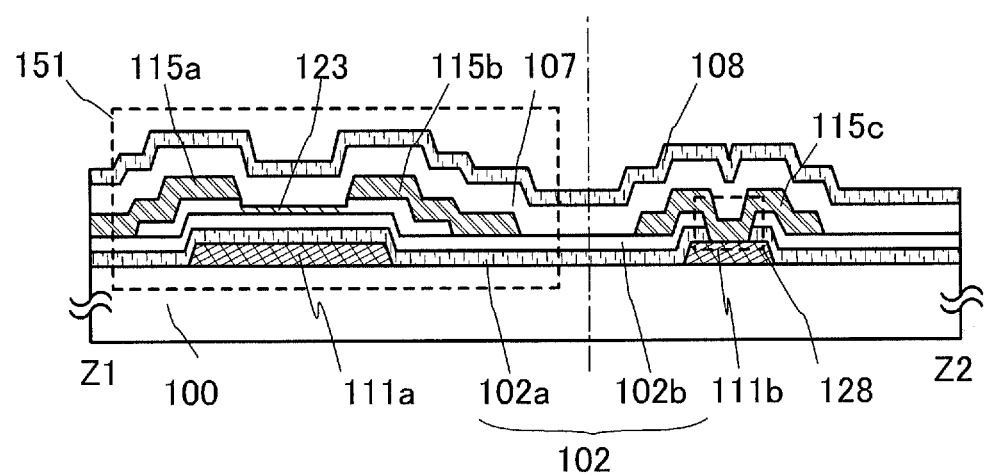
FIG. 1 illustrates a semiconductor element according to an embodiment.

Embodiments are described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a method for manufacturing a semiconductor element is described. Note that in this embodiment, a structure of a thin film transistor illustrated in FIG. 1 and a manufacturing method thereof are described as an example.

FIG. 1 is a cross-sectional view illustrating a thin film transistor 151 of this embodiment. In the thin film transistor 151, a first wiring layer including a gate electrode 111a and a gate wiring layer 111b is formed over a substrate 100, and a gate insulating layer 102 is formed over the gate electrode 111a and the gate wiring layer 111b. The gate insulating layer 102 is a stack of a first gate insulating layer 102a and a second gate insulating layer 102b. An oxide semiconductor layer 123 is formed over the gate electrode 111a with the gate insulating layer 102 interposed therebetween. A source electrode layer and a drain electrode layer (denoted by 115a and 115b) are formed in a manner that end portions of the source layer and the drain electrode layer overlap with the gate electrode 111a. An oxide insulating layer 107 is formed to be in contact with an oxide semiconductor layer 123 which is interposed between the source electrode layer and the drain electrode layer (denoted by 115a and 115b) over the gate electrode 111a. A protective insulating layer 108 is formed over the oxide insulating layer 107.

A contact hole 128 is formed in the gate insulating layer 102 to reach the gate wiring layer 111b. The gate wiring layer 111b and a second wiring layer 115c are connected to each other through the contact hole 128.

A method for manufacturing the thin film transistor 151 of this embodiment is described with reference to FIGS. 2A, 2B, 2C, and 2D. FIGS. 2A to 2D are cross-sectional views illustrating a method for manufacturing the thin film transistor of this embodiment.

First, a glass substrate whose strain point is higher than or equal to 730° C. is preferably used as the substrate 100 in the case where temperature in the following heat treatment is high. As a glass substrate, a glass material such as aluminosilicate glass, aluminoborosilicate glass, or barium borosilicate glass is used, for example. In general, a glass substrate containing more barium oxide (BaO) than boron oxide ($B_2O_3$) is more practical as a heat-resistant glass substrate. Therefore, a glass substrate containing a larger amount of BaO than $B_2O_3$ is preferably used.

Note that a substrate formed of an insulator such as a ceramic substrate, a quartz substrate, or a sapphire substrate may be used instead of the above glass substrate. Crystallized glass or the like may also be used.

An insulating film serving as a base film may be formed between the substrate 100, and the gate electrode 111a and the gate wiring layer 111b, which are described below. The base film has a function of preventing diffusion of an impurity element from the substrate 100, and can be formed to have a single-layer structure or a stacked-layer structure one or more of a silicon nitride film, a silicon oxide film, a silicon nitride oxide film, and a silicon oxynitride film.

After formation of a conductive film over the substrate 100 having an insulating surface, the first wiring layer including the gate electrode 111a and the gate wiring layer 111b is formed through a first photolithography step. End portions of the gate electrode formed are preferably tapered.

Note that a resist mask may be formed by an inkjet method. Formation of the resist mask by an inkjet method needs no photomask; thus, manufacturing cost can be reduced.

As the conductive film for forming the gate electrode 111a and the gate wiring layer 111b, an element selected from Al, Cr, Ta, Ti, Mo, or W, an alloy containing any of these elements as a main component, an alloy containing any of these elements in combination, or the like can be used. The conductive film can be a single layer or a stack formed using a metal material such as copper, neodymium, or scandium, or an alloy material containing any of these materials as a main component, in addition to the above metal. A light-transmitting conductive film may also be used for forming the gate electrode. An example of the light-transmitting conductive film is a transparent conductive oxide film or the like.

Subsequently, the gate insulating layer 102 and an oxide semiconductor layer 103 are formed through successive deposition. In this embodiment, the gate insulating layer 102 and the oxide semiconductor layer 103 are successively formed by sputtering. Here, used is a multi-chamber sputtering apparatus which includes a preheat chamber for the substrate to be processed, and which is provided with a target of silicon or silicon oxide (artificial quarts), and a target for formation of an oxide semiconductor layer.

First, the substrate 100 over which the gate electrode 111a and the gate wiring layer 111b are formed is preheated in the preheat chamber at a temperature of 200° C. or higher, so that impurities attached to the substrate 100 is removed. An example of the impurity is moisture.

In this embodiment, the preheating of the substrate is performed in a reduced-pressure atmosphere and a maximum temperature of the substrate is 200° C.

Next, an insulating film to be the gate insulating layer 102 is formed to cover the gate electrode 111a and the gate wiring layer 111b.

The gate insulating layer 102 includes at least an oxide insulating layer which is in contact with the oxide semiconductor layer. For example, the gate insulating layer 102 can be a single layer of a silicon oxide layer. The gate insulating layer 102 can also be a stack of a silicon nitride layer, a silicon oxynitride layer, or a silicon nitride oxide layer and a silicon oxide layer which is in contact with the oxide semiconductor layer. Note that these layers may be doped with phosphorus (P) or boron (B).

In this embodiment, the gate insulating layer 102 is formed by using a 100 nm-thick stack of a silicon nitride layer (SiNy (y>0)) which is formed as the first gate insulating layer 102a by sputtering and a silicon oxide layer (SiOx (x>0)) which is formed over the first gate insulating layer 102a as the second gate insulating layer 102b by sputtering.

Then, an oxide semiconductor layer is formed over the gate insulating layer 102.

First, the oxide semiconductor layer 103 is formed. The oxide semiconductor layer 103 is formed using an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, an In—Ga—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. Further, the oxide semiconductor layer can be formed by a sputtering method under a rare gas (typically argon) atmosphere, an oxygen atmosphere, or an atmosphere containing a rare gas (typically argon) and oxygen. When a sputtering method is employed, it is preferable that deposition be performed using a target containing $SiO_2$ of 2 wt % to 10 wt % and that $SiO_X$ (X>0) which prevents crystallization be contained in the oxide semiconductor layer so that crystallization of the oxide semiconductor layer during heat treatment for dehydration or dehydrogenation in a subsequent step can be prevented.

In this embodiment, deposition is performed using a metal oxide target including In, Ga, and Zn (composition ratio is $In_2O_3:Ga_2O_3:ZnO=1:1:1$ [mol %] or In:Ga:Zn=1:1:0.5 [at. %]) under the following condition: the distance between a substrate and a target is 100 mm, the pressure is 0.6 Pa, the direct-current (DC) power supply is 0.5 kW, and the atmosphere is oxygen (the flow rate of oxygen is 100%). Note that a pulse direct-current (DC) power supply is preferably used because dust can be reduced and the film thickness can be uniform. As the oxide semiconductor layer 103 in this embodiment, an In—Ga—Zn—O-based film is formed by a sputtering method using the In—Ga—Zn—O-based metal oxide target.

The relative density of the metal oxide target is 90% to 100% inclusive, preferably, 95% to 99.9% inclusive. By using the metal oxide target with high relative density, a dense oxide semiconductor layer is formed.

Note that it is preferable that water, hydrogen, and the like be not contained in an oxygen gas, a nitrogen gas and a rare gas such as helium, neon, or argon which is introduced when the oxide semiconductor layer is formed. It is preferable that the purity of the oxygen gas, the nitrogen gas and the rare gas such as helium, neon, or argon be 6N (99.9999%) or higher, preferably, 7N (99.99999%) or higher (that is, the impurity concentrations is 1 ppm or lower, preferably, 0.1 ppm or lower).

The thickness of the oxide semiconductor layer 103 is preferably 5 nm to 30 nm inclusive. Since appropriate thickness depends on an oxide semiconductor material used, the thickness can be determined as appropriate depending on the material.

In this embodiment, the oxide semiconductor layer 103 is successively formed over the gate insulating layer 102. The multi-chamber sputtering apparatus used here is provided with the target of silicon or silicon oxide (artificial quarts), and the target for formation of an oxide semiconductor layer. A deposition chamber provided with the target for formation of an oxide semiconductor layer is also provided with at least a cryopump as an evacuation unit. The evacuation unit may be a turbo pump provided with a cold trap.

In the deposition chamber which is evacuated with use of the cryopump, a hydrogen atom, a compound containing a hydrogen atom such as $H_2O$, a compound containing a carbon atom, and the like are removed, whereby the impurity concentration in the oxide semiconductor layer formed in the deposition chamber can be reduced.

In particular, a preferable oxide semiconductor layer for the semiconductor element of one embodiment of the present invention is an oxide semiconductor layer in which the hydrogen concentration is reduced to $1 \times 10^{18}$ cm$^{-3}$ to $2 \times 10^{20}$ cm$^{-3}$ inclusive, more preferably, $2 \times 10^{18}$ cm$^{-3}$ to $5 \times 10^{19}$ cm$^{-3}$ inclusive, according to quantified results of secondary ion mass spectrometry (SIMS).

The oxide semiconductor layer 103 is formed in the state where the substrate is heated. In this embodiment, the substrate is heated to 100° C. to 600° C. inclusive, preferably, 200° C. to 400° C. inclusive. By heating the substrate during deposition, the impurity concentration in the oxide semiconductor layer formed can be reduced. In addition, damage by sputtering can be reduced.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Note that before the oxide semiconductor layer 103 is formed by a sputtering method, dust attached to a surface of the gate insulating layer 102 is preferably removed by reverse sputtering in which an argon gas is introduced and plasma is generated. The reverse sputtering refers to a method in which an RF power supply is used for application of a voltage to a substrate side in an argon atmosphere and plasma is generated to modify a surface. Note that instead of an argon atmosphere, a nitrogen atmosphere, a helium atmosphere, an oxygen atmosphere, or the like may be used. FIG. 2A is a cross-sectional view at this stage.

Next, the oxide semiconductor layer 103 is processed into an island shape through a second photolithography step, whereby the oxide semiconductor layer 113 is formed.

Note that a resist mask for formation of the island-shaped oxide semiconductor layer 113 may be formed by an inkjet method. Formation of the resist mask by an inkjet method needs no photomask; thus, manufacturing cost can be reduced.

Then, the contact hole 128 is formed in the gate insulating layer 102 through a third photolithography step. Note that reverse sputtering is preferably performed before formation of a conductive film in a subsequent step, so that a resist residue attached to surfaces of the oxide semiconductor layer 113 and the gate insulating layer 102 is removed. FIG. 2B is a cross-sectional view at this stage.

Although the gate insulating layer is selectively etched for formation of the contact hole 128 which reaches the gate wiring layer 111b through the third photolithography step in this embodiment, there is no limitation to this method. The following method may be employed: after formation of the oxide semiconductor layer 103, a resist mask is formed over the oxide semiconductor layer 103 and a contact hole which reaches the gate electrode 111a is formed; and after formation of the contact hole, the resist mask is removed and a resist mask is formed over the oxide semiconductor layer 103 with use of another photomask, so that the oxide semiconductor layer 103 is selectively etched to be processed into the island-shaped oxide semiconductor layer 113.

Next, a conductive film to be the source electrode layer and the drain electrode layer of the thin film transistor and the like is formed over the gate insulating layer 102, the oxide semiconductor layer 113, and the gate wiring layer 111b through the contact hole 128.

As the conductive film, an element selected from Ti, Mo, W, Al, Cr, Cu, or Ta, an alloy containing any of these elements as a main component, an alloy containing any of these elements in combination, or the like can be used. The conductive film is not limited to a single layer containing the above-described element and may be a stack of two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a Ti film, a titanium nitride film may be used.

When heat treatment at 200° C. to 600° C. is performed, the conductive film preferably has heat resistance high enough to withstand the heat treatment. For example, an aluminum alloy to which an element to prevent a hillock is added or a conductive film which is stacked with a heat-resistant conductive film is preferably used. The conductive film is formed with a sputtering method, a vacuum evaporation method (e.g., an electron beam evaporation method), an arc discharge ion plating method, or a spray method. The conductive film can also be formed by discharging a conductive nanopaste of silver, gold, copper, or the like by a screen printing method, an inkjet method, or the like and baking the nanopaste.

Next, through a fourth photolithography step, a resist mask is formed and the conductive film is selectively etched, so that the second wiring layer (denoted by 115a, 115b and 115c) including the source electrode layer and the drain electrode layer is formed (see FIG. 2C). As shown in FIG. 2C, the second wiring layer 115c is directly connected to the gate wiring layer 111b through the contact hole 128.

In the fourth photolithography step, only portions of the conductive film which are in contact with the oxide semiconductor layer are selectively removed. In the case of using an ammonia peroxide mixture (at a composition weight ratio of hydrogen peroxide:ammonia:water=5:2:2) or the like as an alkaline etchant in order to selectively remove only portions of the conductive film which are in contact with the oxide semiconductor layer, the metal conductive film can be selectively removed, so that the oxide semiconductor layer containing an In—Ga—Zn—O-based oxide semiconductor can remain.

Depending on etching conditions, an exposed region of the oxide semiconductor layer 113 might be etched in some cases through the fourth photolithography step. In that case, the thickness of the oxide semiconductor layer 113 in a region interposed between the source electrode layer and the drain electrode layer (a region interposed between reference numerals 115a and 115b) is smaller than the thickness of the oxide semiconductor layer 113 in a region overlapping with the source electrode layer over the gate electrode 111a or the thickness of the oxide semiconductor layer 113 in a region overlapping with the drain electrode layer over the gate electrode 111a (see FIG. 2C).

Note that a resist mask for forming the second wiring layer (denoted by 115a, 115b, and 115c) including the source electrode layer and the drain electrode layer may be formed by an inkjet method. Formation of the resist mask by an inkjet method needs no photomask; thus, manufacturing cost can be reduced.

Next, the oxide insulating layer 107 is formed over the gate insulating layer 102, the oxide semiconductor layer 113, and the second wiring layer. At this stage, a region where the oxide semiconductor layer 113 and the oxide insulating layer 107 are in contact with each other is formed. The region of the oxide semiconductor layer 113 sandwiched between and in contact with the oxide insulating layer 107 and the gate insulating layer 102, which is an oxide insulating layer, and over the gate electrode 111a is a channel formation region.

The oxide insulating layer in contact with the oxide semiconductor layer is formed using an inorganic insulating film which does not contain an impurity such as moisture, a hydrogen ion, or OH⁻ and prevents their entry from the outside. Typically, a silicon oxide film, a silicon nitride oxide film, an aluminum oxide film, an aluminum oxynitride film, or the like is used. The oxide insulating layer 107 can be formed to a thickness of 1 nm or more by an appropriate method with which impurities such as water and hydrogen are not mixed into the oxide insulating layer, for example, by a sputtering method.

In this embodiment, a silicon oxide film is formed as the oxide insulating layer by a sputtering method. The substrate temperature in deposition may be lower than or equal to 300° C., and is 100° C. in this embodiment. The formation of the silicon oxide film by a sputtering method can be performed in a rare gas (typically, argon) atmosphere, an oxygen atmosphere, or an atmosphere including a rare gas (typically, argon) and oxygen. Since the oxide insulating layer formed by sputtering is especially dense, it can also serve as a protective film which suppresses diffusion of an impurity into a contacting layer, even when it is a single layer. Note that the oxide insulating layer can contain phosphorus (P) or boron (B) by using a target doped with phosphorus (P) or boron (B).

As a target, a silicon oxide target or a silicon target may be used, and the silicon target is particularly preferable. A silicon oxide film formed by sputtering under an oxygen and rare gas atmosphere by using the silicon target contains a large number of dangling bonds of silicon atoms or oxygen atoms.

Since the oxide insulating layer 107 contains many dangling bonds, an impurity contained in the oxide semiconductor layer 113 are more likely to diffuse into the oxide insulating layer 107 through the interface between the oxide semiconductor layer 113 and the oxide insulating layer 107. Specifically, a hydrogen atom, a compound containing a hydrogen atom such as $H_2O$, or the like in the oxide semiconductor layer 113 is more likely to diffuse into the oxide insulating layer 107.

When hydrogen moves to the interface between the oxide semiconductor layer 113 and the oxide insulating layer 107 and the hydrogen concentration at the interface is $1\times10^{19}$ $cm^{-3}$ to $5\times10^{22}$ $cm^{-3}$ inclusive, preferably, $5\times10^{19}$ $cm^{-3}$ to $1\times10^{22}$ $cm^{-3}$ inclusive, the hydrogen concentration in the oxide semiconductor layer is reduced. A semiconductor element including the oxide semiconductor layer with the reduced hydrogen concentration has excellent reliability.

When the hydrogen concentration at the interface between the oxide semiconductor layer 113 and the oxide insulating layer 107 is 5 times to 100 times (preferably 5 times to 10 times) as high as hydrogen concentration in a portion of the oxide insulating layer apart from the interface by 30 nm, hydrogen is more likely to move from the oxide semiconductor layer 113 to the oxide insulating layer 107 through the interface.

In this embodiment, the deposition is performed by a pulsed DC sputtering method using a columnar polycrystalline, boron-doped silicon target which has a purity of 6N (the resistance is 0.01 Ωcm), in which the distance between substrate and target (T-S distance) is 89 mm, the pressure is 0.4 Pa, the direct-current (DC) power source is 6 kW, and the atmosphere is oxygen (the oxygen flow rate is 100%). The thickness is 300 nm.

The oxide insulating layer 107 is provided over and in contact with the channel formation region in the oxide semiconductor layer 113, and functions as a channel protective layer.

Then, the protective insulating layer 108 is formed over the oxide insulating layer 107 (see FIG. 2D). As the protective insulating layer 108, a silicon nitride film, a silicon nitride oxide film, an aluminum nitride film, or the like is used. In this embodiment, a silicon nitride film is formed as the protective insulating layer 108 by RF sputtering.

Through the above steps, the thin film transistor 151 can be manufactured.

Although the gate insulating layer 102 and the oxide semiconductor layer 103 are successively formed in this embodiment, the gate insulating layer 102 may be exposed to air, and then the oxide semiconductor layer 103 may be formed. In that case, the gate insulating layer 102 is preferably subjected to heat treatment (at a temperature higher than or equal to 400° C. and lower than the strain point of the substrate) in an inert gas atmosphere (in nitrogen, helium, neon, argon, or the like). Through this heat treatment, an impurity such as hydrogen or water contained in the gate insulating layer 102 can be removed before formation of the oxide semiconductor layer 103.

The silicon oxide layer, silicon nitride layer, silicon oxynitride layer, or silicon nitride oxide layer may be formed by a plasma CVD method instead of a sputtering method. For example, a silicon oxynitride layer may be formed by a plasma CVD method using $SiH_4$, oxygen, and nitrogen as a deposition gas. The thickness of the gate insulating layer 102 is 100 nm to 500 nm inclusive. In the case of using a stack, for example, the stack is the first gate insulating layer 102a with a thickness of 50 nm to 200 nm inclusive and the second gate insulating layer 102b with a thickness of 5 nm to 300 nm inclusive over the first gate insulating layer 102a. When the film formed by a plasma CVD method or the like contains an impurity such as hydrogen or water, the above-described heat treatment is preferably performed so that the impurity is removed, and then the oxide semiconductor layer is formed.

Although the gate insulating layer 102 is selectively etched through the third photolithography step and the contact hole 128 which reaches the gate wiring layer 111b is formed in this embodiment, there is no limitation to this method. For example, after formation of the gate insulating layer 102, a resist mask may be formed over the gate insulating layer and the contact hole which reaches the gate wiring layer 111b may be formed.

After formation of the oxide semiconductor layer, the oxide semiconductor layer may be subjected to dehydration or dehydrogenation.

The temperature of first heat treatment in which dehydration or dehydrogenation is performed is higher than or equal to 400° C. and lower than 750° C., preferably, 425° C. or higher. Note that in the case of the temperature that is 425° C. or higher, the heat treatment time may be one hour or shorter, whereas in the case of the temperature lower than 425° C., the heat treatment time is longer than one hour. In the first heat treatment, the substrate is introduced into an electric furnace, which is one of heat treatment apparatuses, and heat treatment is performed on the oxide semiconductor layer in a nitrogen atmosphere. After that, the oxide semiconductor layer is not exposed to air, and reincorporation of water and hydrogen into the oxide semiconductor layer is prevented, so that the oxide semiconductor layer with reduced hydrogen concentration is obtained. Slow cooling is performed from a heating temperature T at which the dehydration or dehydrogenation is performed on the oxide semiconductor layer to such a temperature that water is not contained again, specifically, to a temperature that is lower than the heating temperature T by 100° C. or more, under a nitrogen atmosphere in one furnace. Without limitation to a nitrogen atmosphere, dehydration or dehydrogenation is performed in helium, neon, argon or the like.

The heat treatment apparatus is not limited to the electric furnace, and may be, for example, an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed by thermal radiation using light emitted from the above-described lamp and by conduction of heat from a gas heated by light emitted from the lamp. As the gas, an inert gas which does not react with a process object by heat treatment, such as nitrogen or a rare gas such as argon is used. Further, an LRTA apparatus or a GRTA apparatus may have not only a lamp but also a device for heating an object to be processed by conduction of heat or radiation of heat from a heater such as a resistance heater.

In the first heat treatment, it is preferable that water, hydrogen, and the like be not contained in nitrogen or a rare gas such as helium, neon, or argon. It is preferable that the purity of nitrogen or the rare gas such as helium, neon, or argon which is introduced into a heat treatment apparatus be 6N (99.9999%) or higher, preferably, 7N (99.99999%) or higher (that is, the impurity concentration is 1 ppm or lower, preferably, 0.1 ppm or lower).

Depending on conditions of the first heat treatment or a material of the oxide semiconductor layer, the oxide semiconductor layer is crystallized to be a microcrystalline film or a polycrystalline film in some cases. For example, the oxide semiconductor layer may become a microcrystalline oxide semiconductor layer having a degree of crystallization of 90% or more, or 80% or more in some cases. Further, depending on the conditions of the first heat treatment and the material of the oxide semiconductor layer, the oxide semiconductor layer becomes amorphous oxide semiconductor layer containing no crystalline component in other cases.

After the first heat treatment, the oxide semiconductor layer becomes an oxygen-deficiency oxide semiconductor, in other words, the resistivity becomes lower. The carrier concentration in the oxide semiconductor layer after the first heat treatment is higher than that in the oxide semiconductor layer right after the deposition; it is preferable that the oxide semiconductor layer have a carrier concentration of $1\times10^{18}$ $cm^{-3}$ or more.

Depending on conditions of the first heat treatment or a material of the gate electrode 111*a* and the gate wiring layer 111*b*, the oxide semiconductor layer is crystallized to be a microcrystalline film or a polycrystalline film in some cases. For example, in the case where films of an alloy of indium oxide and tin oxide are used as the gate electrode 111*a* and the gate wiring layer 111*b*, the oxide semiconductor layer is crystallized by the first heat treatment at 450° C. for one hour. In contrast, in the case where films of an alloy of indium oxide and tin oxide containing silicon oxide are used as the gate electrode 111*a* and the gate wiring layer 111*b*, the oxide semiconductor layer is not crystallized.

The first heat treatment of the oxide semiconductor layer can be performed on the oxide semiconductor layer 103 before being processed into an island-shaped oxide semiconductor layer 113. In that case, the substrate is taken out of the heat apparatus after the first heat treatment, and then a photolithography step is performed.

After formation of the oxide insulating layer 107, second heat treatment at a temperature of 200° C. to 400° C. inclusive, for example, 250° C. to 350° C. inclusive) may be performed in an inert gas atmosphere or a nitrogen atmosphere.

For example, the second heat treatment is performed in a nitrogen atmosphere at 250° C. for one hour. In the second heat treatment, heating is performed in the state where part of the oxide semiconductor layer 113 is in contact with the oxide insulating layer 107 and other part of the oxide semiconductor layer 113 is in contact with the second wiring layer (denoted by 115*a* and 115*b*).

When the second heat treatment is performed in the state where the oxide semiconductor layer 113 where the resistivity is lowered through the first heat treatment is in contact with the oxide insulating layer 107, a vicinity of the region of the oxide semiconductor layer 113 in contact with the oxide insulating layer 107 becomes an oxygen-excess oxide semiconductor. Thus, resistivity becomes higher (the vicinity of the region of the oxide semiconductor layer becomes an I-type oxide semiconductor) in a direction from the region of the oxide semiconductor layer 113 in contact with the oxide insulating layer 107 toward the bottom of the oxide semiconductor layer 113.

Specifically, the oxide semiconductor layer 123 having the region where the resistivity is increased (the I-type oxide semiconductor) from the interface between the oxide semiconductor layer 113 and the oxide insulating layer 107 toward the gate insulating layer 102 is formed.

Since the oxide semiconductor layer where the resistivity is increased (the I-type oxide semiconductor) is formed in the channel formation region of the thin film transistor 151, the threshold voltage is a positive value and the thin film transistor 151 behaves as an enhancement-type thin film transistor.

By performing the second heat treatment in the state where a vicinity of a region of the oxide semiconductor layer 113 is in contact with the second wiring layer (denoted by 115*a* and 115*b*) formed using a metal conductive film, oxygen is more likely to move to the metal conductive film and a resistivity of the region of the oxide semiconductor layer further becomes lower (an N-type oxide semiconductor).

There is no particular limitation on the timing of the second heat treatment as long as it is after formation of the oxide insulating layer 107.

By using the oxide semiconductor layer in which the impurity concentration is suppressed by the method described in this embodiment, a highly reliable semiconductor element can be provided. Specifically, a thin film transistor including the oxide semiconductor with a controlled threshold voltage can be provided. In addition, a thin film transistor including an oxide semiconductor with high operation speed, relatively easy manufacturing process, and sufficient reliability can be provided.

In addition, with this embodiment, a method for manufacturing a thin film transistor including an oxide semiconductor with a controlled threshold voltage, high operation speed, a relatively easy manufacturing process, and sufficient reliability can be provided.

Further, it is possible to reduce a degree of shift of the threshold voltage when BT stress testing (bias-temperature stress testing) is performed, and a highly reliable thin film transistor can be provided. Note that the BT stress testing (bias-temperature stress testing) in this specification refers to testing in which a high gate voltage is applied to a thin film transistor in a high temperature atmosphere.

This embodiment can be combined with any of the other embodiments in this specification as appropriate.

(Embodiment 2)

In this embodiment, an apparatus for successive deposition used for manufacturing a semiconductor element of one embodiment of the present invention and a method for deposition with use of the apparatus are described. Note that in this embodiment, a process of successive deposition is described, and the other process may be performed in accordance with Embodiment 1 to manufacture of a thin film transistor.

Figure 3:
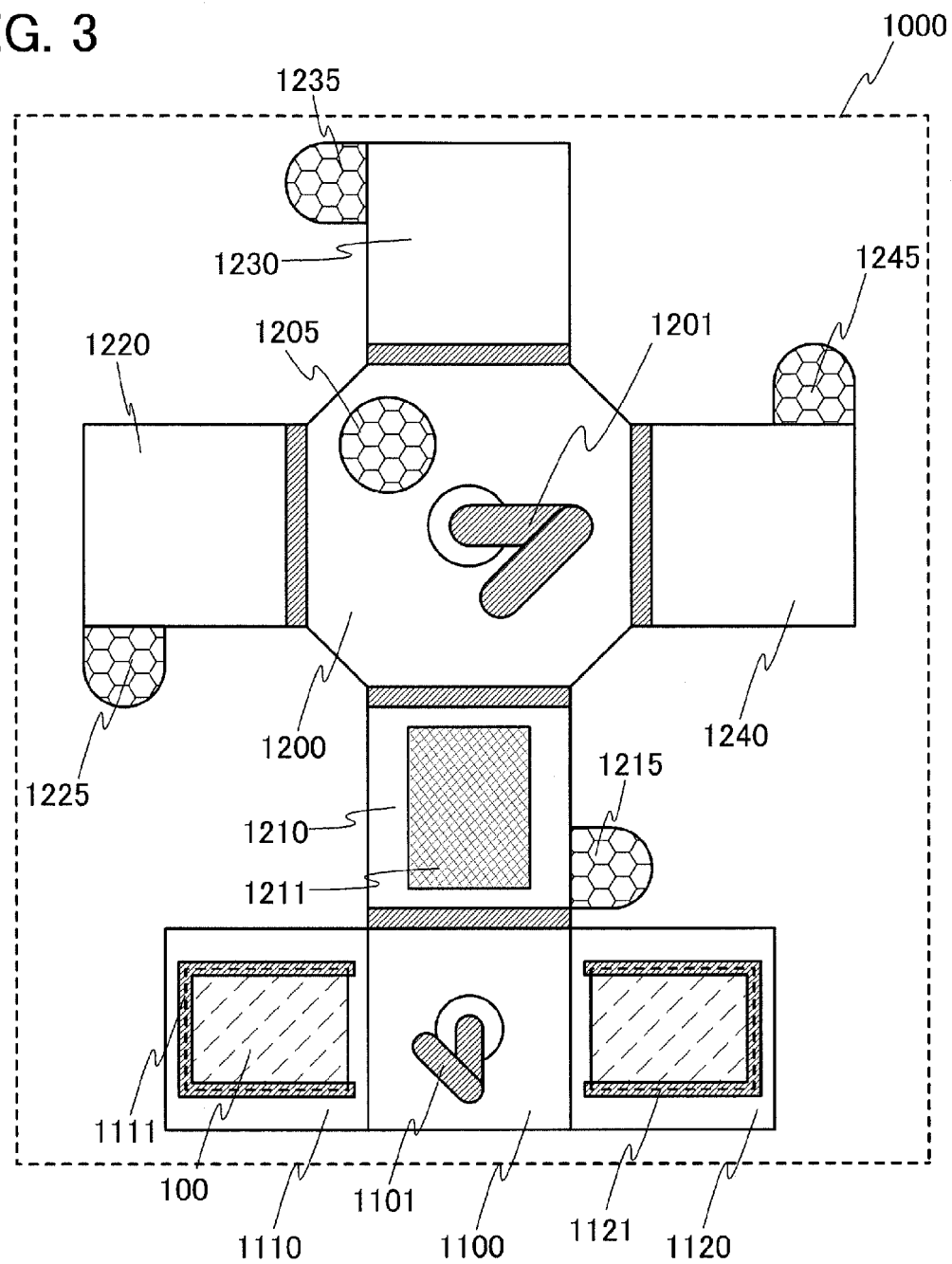
FIG. 3 illustrates a deposition apparatus according to an embodiment.

An apparatus for successive deposition 1000 used in this embodiment is illustrated in FIG. 3. The apparatus for successive deposition 1000 includes a load chamber 1110 and an unload chamber 1120. The load chamber 1110 and the unload chamber 1120 are respectively provided with a cassette 1111 which stores a substrate before treatment and a cassette 1121 which stores a substrate after treatment. A first transfer chamber 1100 is provided between the load chamber 1110 and the unload chamber 1120, and is provided with a transfer unit 1101 which transfers a substrate.

In addition, the apparatus for successive deposition 1000 includes a second transfer chamber 1200. The second transfer chamber 1200 is provided with the transfer unit 1201. Four treatment chambers (a first treatment chamber 1210, a second treatment chamber 1220, a third treatment chamber 1230, and a fourth treatment chamber 1240) are connected to the second transfer chamber 1200 through gate valves, and are arranged around the second transfer chamber 1200. Note that one side of the first treatment chamber 1210 is connected to the first transfer chamber 1100 through a gate valve, and the other side of the first treatment chamber 1210 is connected to the second transfer chamber 1200 through a gate valve.

Note that the pressure in the first transfer chamber 1100, the load chamber 1110, and the unload chamber 1120 is atmospheric pressure. The second transfer chamber 1200, the first treatment chamber 1210, the second treatment chamber 1220, the third treatment chamber 1230, and the fourth treatment chamber 1240 are respectively provided with an evacuation unit 1205, an evacuation unit 1215, an evacuation unit 1225, an evacuation unit 1235, and an evacuation unit 1245, so that a reduced-pressure state can be realized. Although the evacuation unit may be selected in accordance with the use application of each treatment chamber, an evacuation unit such as a cryopump is particularly preferable. Alternatively, a turbo pump provided with a cold trap may be used.

In the case where the oxide semiconductor layer is formed, an evacuation unit such as a cryopump is preferably used in order to prevent impurities from being contained in steps of formation of films in contact with the oxide semiconductor layer and steps before and after formation of the oxide semiconductor layer, and needless to say, in the treatment chamber for forming the oxide semiconductor layer.

A substrate-heating unit 1211 is provided in the first treatment chamber 1210. As the substrate-heating unit, a hot plate, an RTA, or the like can be used. The first treatment chamber 1210 serves as a delivery chamber for transferring a substrate from the first transfer chamber 1100 in an atmospheric-pressure state into the second transfer chamber 1200 in a reduced-pressure state. By provision of the delivery chamber, the second transfer chamber 1200 can be prevented from being contaminated by air.

The second treatment chamber 1220, the third treatment chamber 1230, and the fourth treatment chamber 1240 are each provided with a sputtering apparatus and a substrate-heating unit. As the substrate-heating unit, a hot plate, an RTA, or the like can be used.

An example of operation of the apparatus for successive deposition 1000 is described. Here, a method for successively forming a gate insulating film and an oxide semiconductor layer over a substrate over which a gate electrode is formed is described. Note that the method for successive deposition can be applied to a manufacturing process of the thin film transistor described in Embodiment 1, as an example.

First, the transfer unit 1101 transfers the substrate 100 over which the gate electrode is formed into the first treatment chamber 1210 in an atmospheric-pressure state from the cassette 1111. Next, the gate valve is closed, and the first treatment chamber 1210 is evacuated. The substrate 100 is preheated in the first treatment chamber 1210, so that impurities attached to the substrate are eliminated and evacuated. Examples of the impurities are a hydrogen atom, a compound containing a hydrogen atom such as $H_2O$, a compound containing a carbon atom, and the like. Note that the temperature at the preheating is lower than or equal to 600° C., preferably, higher than or equal to 100° C. and lower than or equal to 400° C.

Next, the substrate 100 is transferred into the second treatment chamber 1220, and a silicon nitride film is formed. Then, the substrate 100 is transferred into the third treatment chamber 1230 thorough the second transfer chamber 1200, and a silicon oxide film is formed to be stacked over the silicon nitride film. The second treatment chamber 1220 and the third treatment chamber 1230 are evacuated with use of a cryopump or the like, so that the impurity concentration in the treatment chambers is reduced. The silicon nitride film and the silicon oxide film stacked in the treatment chambers in which the impurity concentration is reduced serve as the gate insulating film with reduced impurity concentration.

The substrate 100 over which the silicon nitride film and the silicon oxide film are successively formed on the gate electrode is transferred into the fourth treatment chamber 1240. The fourth treatment chamber 1240 is provided with a target for formation of an oxide semiconductor layer, and a cryopump as an evacuation unit.

Next, an oxide semiconductor layer is formed on the silicon oxide film over the substrate 100. In an oxide semiconductor layer formed in a treatment chamber where impurities are reduced, the impurity concentration is suppressed. Specifically, hydrogen concentration in the oxide semiconductor layer can be reduced. In addition, the oxide semiconductor layer is formed in the state where the substrate is heated. In this embodiment, the substrate temperature is 100° C. to 600° C. inclusive, preferably, 200° C. to 400° C. inclusive. By forming the oxide semiconductor layer in the state where the substrate is heated, the impurity concentration in the oxide semiconductor layer formed can be reduced.

The relative density of a metal oxide target is 90% to 100% inclusive, preferably, 95% to 99.9% inclusive. By using the metal oxide target with high relative density, a dense oxide semiconductor layer is formed.

Note that it is preferable that water, hydrogen, and the like be not contained in an oxygen gas, a nitrogen gas and a rare gas such as helium, neon, or argon which is introduced when the oxide semiconductor layer is formed. It is preferable that the purity of the oxygen gas, the nitrogen gas and the rare gas such as helium, neon, or argon be 6N (99.9999%) or higher, preferably, 7N (99.99999%) or higher (that is, the impurity concentrations is 1 ppm or lower, preferably, 0.1 ppm or lower).

In the above manner, by successive deposition in treatment chambers each of which is evacuated with use of a cryopump and where impurities are reduced, the impurity concentration in the layers included in a semiconductor element can be suppressed.

With use of an apparatus for successive deposition to which an evacuation unit such as a cryopump is applied, impurities in a treatment chamber can be reduced. Impurities attached to the inner wall of the treatment chamber are eliminated, and incorporation of impurities into a substrate during deposition and a film can be reduced.

The incorporation of impurities is suppressed in the oxide semiconductor layer formed with use of the apparatus for successive deposition described in this embodiment. Therefore, by using the oxide semiconductor layer, a semiconductor element with high reliability can be provided. Specifically, a thin film transistor including an oxide semiconductor with a controlled threshold voltage can be provided. In addition, a thin film transistor including an oxide semiconductor with high operation speed, a relatively easy manufacturing process, and sufficient reliability can be provided.

In addition, with use of the apparatus for successive deposition described in this embodiment, a method for manufacturing a thin film transistor including an oxide semiconductor layer with a controlled threshold voltage, high operation speed, a relatively easy manufacturing process, and sufficient reliability can be provided.

Further, it is possible to reduce a degree of shift of the threshold voltage when BT stress testing (bias-temperature stress testing) is performed, and a highly reliable thin film transistor can be provided.

A structure in which three or more treatment chambers are connected through a transfer chamber is employed in this embodiment; however, there is no limitation to this structure. For example, a so-called in-line structure may be employed in which the entrance and the exit for the substrate are provided and the treatment chambers are connected to each other.

This embodiment can be combined with any of the other embodiments in this specification as appropriate.
(Embodiment 3)

In this embodiment, an apparatus for forming an oxide semiconductor layer and a method for forming the oxide semiconductor layer with use of the apparatus are described. Note that in this embodiment, a process of forming the oxide semiconductor layer is described, and the other process may be performed in accordance with Embodiment 1 to manufacture of a thin film transistor.

Figure 4:
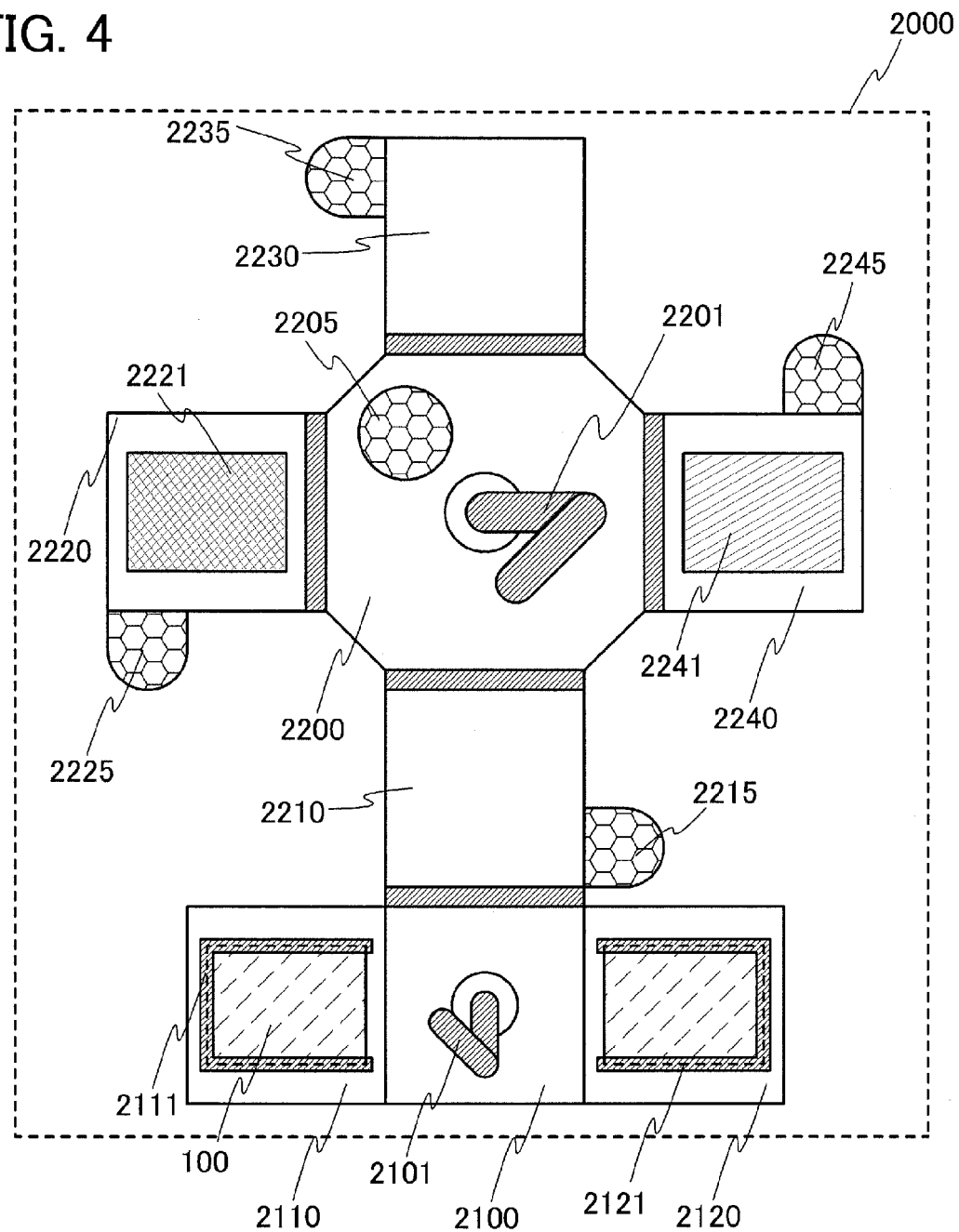
FIG. 4 illustrates a deposition apparatus according to an embodiment.

A deposition apparatus 2000 used in this embodiment is illustrated in FIG. 4.

The deposition apparatus 2000 includes a load chamber 2110 and an unload chamber 2120. The load chamber 2110 and the unload chamber 2120 are respectively provided with a cassette 2111 which stores a substrate before treatment and a cassette 2121 which stores a substrate after treatment. A first transfer chamber 2100 is provided between the load chamber 2110 and the unload chamber 2120, and is provided with a transfer unit 2101 which transfers a substrate.

In addition, the deposition apparatus 2000 includes a second transfer chamber 2200. The second transfer chamber 2200 is provided with the transfer unit 2201. Four treatment chambers (a first treatment chamber 2210, a second treatment chamber 2220, a third treatment chamber 2230, and a fourth treatment chamber 2240) are connected to the second transfer chamber 2200 through gate valves, and are arranged around the second transfer chamber 2200. Note that one side of the first treatment chamber 2210 is connected to the first transfer chamber 2100 through a gate valve, and the other side of the first treatment chamber 2210 is connected to the second transfer chamber 2200 through a gate valve.

Note that the pressure in the first transfer chamber 2100, the load chamber 2110, and the unload chamber 2120 is atmospheric pressure. The second transfer chamber 2200, the first treatment chamber 2210, the second treatment chamber 2220, the third treatment chamber 2230, and the fourth treatment chamber 2240 are respectively provided with an evacuation unit 2205, an evacuation unit 2215, an evacuation unit 2225, an evacuation unit 2235, and an evacuation unit 2245, so that a reduced-pressure state can be realized. Although the evacuation unit may be selected in accordance with the use application of each treatment chamber, an evacuation unit such as a cryopump is particularly preferable. Alternatively, a turbo pump provided with a cold trap may be used.

An evacuation unit such as a cryopump is preferably used in order to prevent impurities from being contained in steps before and after formation of the oxide semiconductor layer, and needless to say, in the treatment chamber for forming the oxide semiconductor layer.

The first treatment chamber 2210 serves as a delivery chamber for transferring a substrate from the first transfer chamber 2100 in an atmospheric-pressure state into the second transfer chamber 2200 in a reduced-pressure state. By provision of the delivery chamber, the second transfer chamber 2200 can be prevented from being contaminated by air.

The second treatment chamber 2220 is provided with a substrate-heating unit 2221. As the substrate-heating unit, a hot plate, an RTA, or the like can be used. The third treatment chamber 2230 is provided with a sputtering apparatus and a substrate-heating unit. As the substrate-heating unit, a hot plate, an RTA, or the like can be used. In addition, the fourth treatment chamber 2240 is provided with a cooling unit 2241.

A method for forming an oxide semiconductor layer with use of the deposition apparatus 2000 for formation of an oxide semiconductor layer is described. Here, a method for forming the oxide semiconductor layer over a substrate over which a gate electrode and a gate insulating film on the gate electrode are formed in advance is described. Note that the deposition method can be applied to a manufacturing process of the thin film transistor described in Embodiment 1, as an example.

First, the transfer unit 2101 transfers the substrate 100 over which the gate insulating film is formed over the gate electrode into the first treatment chamber 2210 in an atmospheric-pressure state from the cassette 2111. Next, the gate valve is closed, and the first treatment chamber 2210 is evacuated. When the pressure in the first treatment chamber 2210 and the pressure in the second transfer chamber 2200 are substantially equal, the gate valve is opened and the substrate 100 is transferred from the first treatment chamber 2210 into the second treatment chamber 2220 through the second transfer chamber 2200.

Next, the substrate 100 is preheated by the substrate-heating unit 2221 in the second treatment chamber 2220, so that impurities attached to the substrate are eliminated and evacuated. Examples of the impurities are a hydrogen atom, a compound containing a hydrogen atom such as $H_2O$, a compound containing a carbon atom, and the like. Note that the temperature at the preheating is lower than or equal to 600° C., preferably, higher than or equal to 100° C. and lower than or equal to 400° C. As an evacuation unit provided for the second treatment chamber 2220, a cryopump is preferably used. Since impurities attached to the substrate 100 are eliminated by the preheating and diffuse into the second treatment chamber 2220, the impurities should be evacuated from the second treatment chamber 2220 with use of a cryopump.

Next, the substrate 100 is transferred into the third treatment chamber 2230, and an oxide semiconductor layer is formed. The third treatment chamber 2230 is evacuated with use of a cryopump or the like, so that the impurity concentration in the treatment chambers is reduced. In an oxide semiconductor layer formed in a treatment chamber where impurities are reduced, the impurity concentration is suppressed. Specifically, hydrogen concentration in the oxide semiconductor layer can be reduced. In addition, the oxide semiconductor layer is formed in the state where the substrate is heated. In this embodiment, the substrate temperature is 100° C. to 600° C. inclusive, preferably, 200° C. to 400° C. inclusive. By forming the oxide semiconductor layer in the state where the substrate is heated, the impurity concentration in the oxide semiconductor layer formed can be reduced.

The relative density of a metal oxide target is 90% to 100% inclusive, preferably, 95% to 99.9% inclusive. By using the metal oxide target with high relative density, a dense oxide semiconductor layer is formed.

After that, the substrate 100 is transferred into the fourth treatment chamber 2240. The substrate 100 is cooled to such low temperature that reincorporation of impurities such as water is suppressed from the substrate temperature T at the heat treatment after the deposition. Specifically, slow cooling is performed so that the temperature becomes 100° C. or more lower than the substrate temperature T. Cooling may be performed with helium, neon, argon, or the like introduced into the fourth treatment chamber 2240. Note that it is preferable that water, hydrogen, or the like be not included in nitrogen or a rare gas such as helium, neon, or argon which is used for the cooling. The purity of nitrogen or a rare gas such as helium, neon, or argon is preferably 6N (99.9999%) or more, more preferably, 7N (99.99999%) or more (that is, the impurity concentration is 1 ppm or less, preferably, 0.1 ppm or less).

In the above manner, by deposition in a treatment chamber which is evacuated with use of a cryopump and where impurities are reduced, an oxide semiconductor layer is not exposed to air, which prevents reincorporation of water and hydrogen into the oxide semiconductor layer, so that the oxide semiconductor layer with suppressed impurity concentration can be obtained.

With use of a deposition apparatus to which an evacuation unit such as a cryopump is applied, impurities in a treatment chamber can be reduced. Impurities attached to the inner wall of the treatment chamber are eliminated, and incorporation of impurities into a substrate during deposition and a film can be reduced. In addition, impurities which are eliminated from an atmosphere during preheating are evacuated, whereby the impurities can be prevented from being attached to the substrate again.

The incorporation of impurities is suppressed in the oxide semiconductor layer formed with use of the deposition apparatus described in this embodiment. Therefore, by using the oxide semiconductor layer, a semiconductor element with high reliability can be provided. Specifically, a thin film transistor including an oxide semiconductor with a controlled threshold voltage can be provided. In addition, a thin film transistor including an oxide semiconductor with high operation speed, a relatively easy manufacturing process, and sufficient reliability can be provided.

In addition, with the apparatus for successive deposition described in this embodiment, a method for manufacturing a thin film transistor including an oxide semiconductor layer with a controlled threshold voltage, high operation speed, a relatively easy manufacturing process, and sufficient reliability can be provided.

Further, it is possible to reduce a degree of shift of the threshold voltage when BT stress testing (bias-temperature stress testing) is performed, and a highly reliable thin film transistor can be provided.

A structure in which three or more treatment chambers are connected through a transfer chamber is employed in this embodiment; however, there is no limitation to this structure. For example, a so-called in-line structure may be employed in which the entrance and the exit for the substrate are provided and the treatment chambers are connected to each other.

This embodiment can be combined with any of the other embodiments in this specification as appropriate.

(Embodiment 4)

In this embodiment, an apparatus for successive deposition of an oxide insulating layer and a protective film over an oxide semiconductor layer, and a method for successive deposition of the oxide insulating layer and the protective film with use of the apparatus are described. Note that in this embodiment, a process for forming the oxide insulating layer and the protective film is described, and the other process can be performed in accordance with Embodiment 1 to manufacture a thin film transistor.

Figure 5:
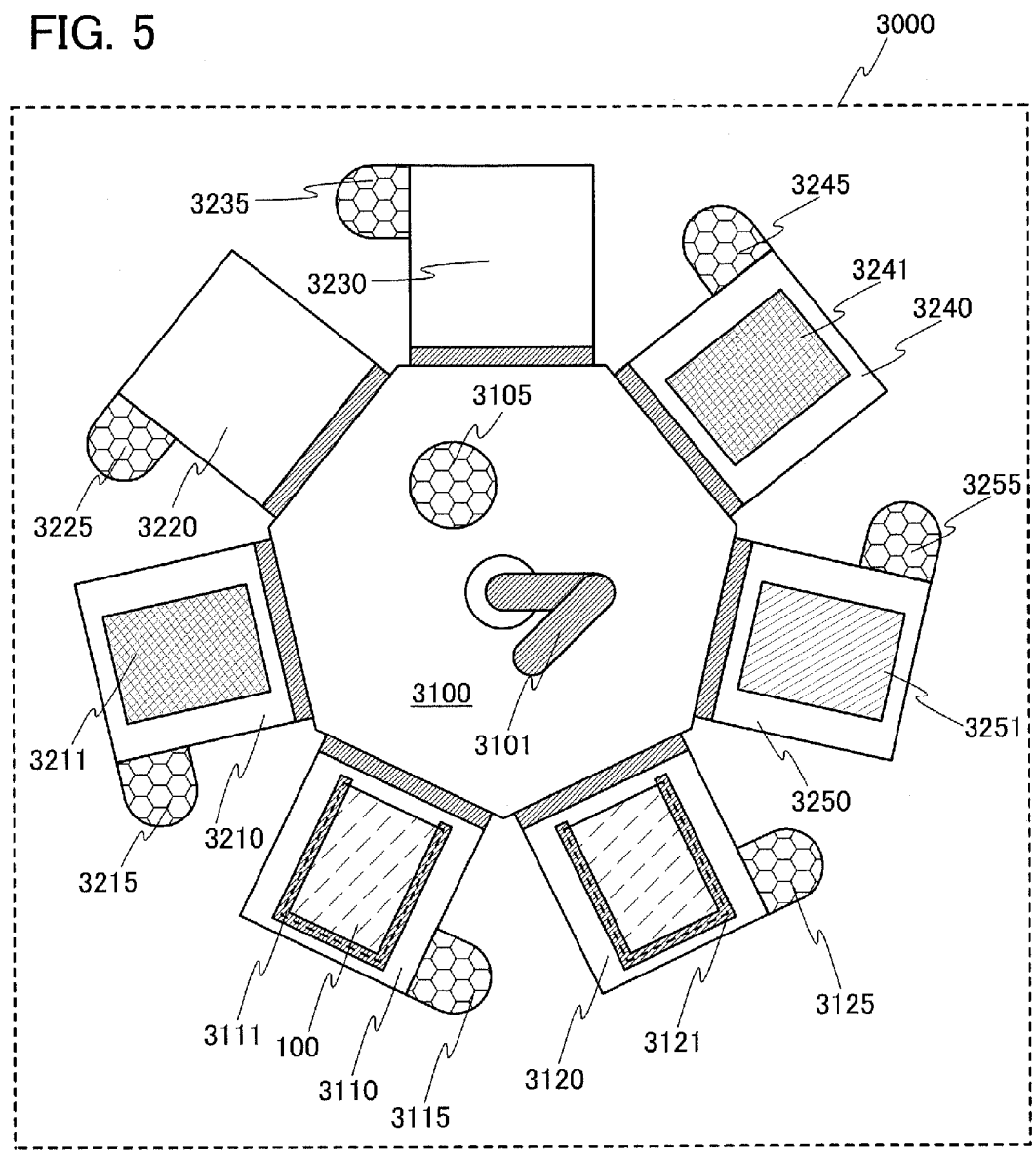
FIG. 5 illustrates a deposition apparatus according to an embodiment.

An apparatus for successive deposition 3000 used in this embodiment is illustrated in FIG. 5. The apparatus for successive deposition 3000 includes a load chamber 3110 and an unload chamber 3120. The load chamber 3110 and the unload chamber 3120 are respectively provided with a cassette 3111 which stores a substrate before treatment and a cassette 3121 which stores a substrate after treatment.

In addition, the apparatus for successive deposition 3000 includes a first transfer chamber 3100. The first transfer chamber 3100 is provided with a transfer unit 3101. Five treatment chambers (a first treatment chamber 3210, a second treatment chamber 3220, a third treatment chamber 3230, a fourth treatment chamber 3240, and a fifth treatment chamber 3250) are connected to the first transfer chamber 3100 through gate valves, and are arranged around the first transfer chamber 3100.

The load chamber 3110, the unload chamber 3120, the first transfer chamber 3100, the first treatment chamber 3210, the second treatment chamber 3220, the third treatment chamber 3230, the fourth treatment chamber 3240, and the fifth treatment chamber 3250 are respectively provided with an evacuation unit 3115, an evacuation unit 3125, an evacuation unit 3105, an evacuation unit 3215, an evacuation unit 3225, an evacuation unit 3235, an evacuation unit 3245, and an evacuation unit 3255, so that a reduced pressure can be realized. Although the evacuation unit may be selected in accordance with the use application of each treatment chamber, an evacuation unit such as a cryopump is particularly preferable. Alternatively, as the evacuation unit, a turbo pump provided with a cold trap may be used.

An evacuation unit such as a cryopump is preferably used in order to prevent impurities from being contained in steps before and after formation of the oxide semiconductor layer.

The load chamber 3110 and the unload chamber 3120 each serve as a delivery chamber for transferring a substrate from a room in an atmospheric-pressure state into the first transfer chamber 3100 in a reduced-pressure state. By provision of the delivery chamber, the first transfer chamber 3100 can be prevented from being contaminated by air.

The first treatment chamber 3210 and the fourth treatment chamber 3240 are respectively provided with a substrate-heating unit 3211 and a substrate-heating unit 3241. As the substrate-heating unit, a hot plate, an RTA, or the like can be used. The second treatment chamber 3220 and the third treatment chamber 3230 are each provided with a sputtering apparatus and a substrate-heating unit. As the substrate-heating unit, a hot plate, an RTA, or the like can be used. In addition, the fifth treatment chamber 3250 is provided with a cooling unit 3251.

Next, an example of operation of the apparatus for successive deposition 3000 is described. Here, a method for forming an oxide insulating layer in contact with the oxide semiconductor layer over a substrate over which a gate insulating film is formed on a gate electrode, an oxide semiconductor layer is formed over the gate electrode with the gate insulating film therebetween, and a source electrode and a drain electrode are formed so that end portions of the source electrode and the drain electrode overlap with the gate electrode, and for successively forming a protective film is described. Note that the method for successive deposition can be applied to a manufacturing process of the thin film transistor described in Embodiment 1, as an example.

First, the load chamber 3110 is evacuated so that the load chamber 3110 is made to have substantially the same pressure as the first transfer chamber 3100, and then, the substrate 100 is transferred from the load chamber 3110 into the first treatment chamber 3210 through the first transfer chamber 3100 with the gate valve opened.

Next, the substrate 100 is preheated by the substrate-heating unit 3211 in the first treatment chamber 3210, so that impurities attached to the substrate are eliminated and evacuated. Examples of the impurities are a hydrogen atom, a compound containing a hydrogen atom such as $H_2O$, a compound containing a carbon atom, and the like. Note that the temperature at the preheating is lower than or equal to 600° C., preferably, higher than or equal to 100° C. and lower than or equal to 400° C. As an evacuation unit provided for the first treatment chamber 3210, a cryopump is preferably used. Since impurities attached to the substrate 100 are eliminated by the preheating and diffuse into the first treatment chamber 3210, the impurities should be evacuated from the first treatment chamber 3210 with use of a cryopump.

Next, the substrate 100 is transferred into the second treatment chamber 3220, and an oxide insulating layer is formed. The second treatment chamber 3220 is evacuated with use of a cryopump or the like, so that the impurity concentration in the treatment chambers is reduced. In an oxide insulating layer formed in a treatment chamber where impurities are reduced, the impurity concentration is suppressed. Specifically, hydrogen concentration in the oxide insulating layer can be reduced. In addition, the oxide insulating layer is formed in the state where the substrate is heated. In this embodiment, the substrate temperature is 100° C. to 600° C. inclusive, preferably, 200° C. to 400° C. inclusive, more preferably, 250° C. to 300° C. inclusive. By forming the oxide insulating layer in the state where the substrate is heated, the concentration of dangling bonds in the oxide insulating layer formed can be increased.

In the case where a silicon oxide is deposited as the oxide insulating layer with use of a sputtering apparatus, a silicon oxide target or a silicon target can be used as a target. In particular, a silicon target is preferably used. The silicon oxide film formed by a sputtering method under an atmosphere including oxygen and a rare gas and by using a silicon target includes a large number of dangling bonds of silicon atoms or oxygen atoms.

By provision of the oxide insulating layer including a large number of dangling bonds in contact with the oxide semiconductor layer, impurities in the oxide semiconductor layer are more likely to diffuse into the oxide insulating layer through the interface between the oxide semiconductor layer and the oxide insulating layer. Specifically, a hydrogen atom or a compound containing a hydrogen atom such as $H_2O$ in the oxide semiconductor layer is more likely to diffuse into the oxide insulating layer. As a result, the impurity concentration in the oxide semiconductor layer is reduced, and an increase in carrier concentration due to an impurity is suppressed.

Next, the substrate 100 is transferred into the third treatment chamber 3230, and the protective insulating layer is formed over the oxide insulating layer. As the protective insulating layer, a film having a function of preventing diffusion of impurity elements is used; for example, a single layer or a stack of one or more films selected from a silicon nitride film, a silicon nitride oxide film, a silicon oxynitride film, or the like can be used. The third treatment chamber 3230 is preferably evacuated with use of a cryopump or the like so that the impurity concentration in the treatment chamber can be reduced.

The protective insulating layer prevents diffusion and entry of impurities from an outer atmosphere of the oxide semiconductor layer. Examples of the impurities are hydrogen, a compound containing a hydrogen atom such as $H_2O$, a compound containing a carbon atom, and the like.

In the case where a silicon nitride film is formed as the protective insulating layer with use of a sputtering apparatus, the protective insulating layer can be formed in the following manner: a silicon target is used; a mixed gas of nitrogen and argon is introduced into the third treatment chamber 3230; and reactive sputtering is performed. The substrate temperature is set to higher than or equal to 200° C. and lower than or equal to 400° C., for example, higher than or equal to 200° C. and lower than or equal to 350° C. Through the deposition at high temperature, impurities containing a hydrogen atom can diffuse into and be enclosed in the oxide insulating layer such as a silicon oxide layer. In particular, the substrate temperature is preferably higher than or equal to 200° C. and lower than or equal to 350° C. so that diffusion of hydrogen atoms can be promoted.

Next, the substrate 100 is transferred into the fourth treatment chamber 3240, and heat treatment after deposition is performed. The substrate temperature at the heat treatment after deposition is higher than or equal to 100° C. and lower than or equal to 600° C. Through the heat treatment, impurities contained in the oxide semiconductor layer are more likely to diffuse into the oxide insulating layer through the interface between the oxide semiconductor layer and the oxide insulating layer. Specifically, a hydrogen atom, a compound containing a hydrogen atom such as $H_2O$, or a compound containing a carbon atom in the oxide semiconductor layer is more likely to diffuse into the oxide insulating layer. As a result, the impurity concentration in the oxide semiconductor layer is reduced, and an increase in carrier concentration due to an impurity is suppressed.

After that, the substrate 100 is transferred into the fifth treatment chamber 3250. The substrate 100 is cooled to such low temperature that reincorporation of impurities such as water is suppressed from the substrate temperature T at the heat treatment after the deposition. Specifically, slow cooling is performed so that the temperature becomes 100° C. or more lower than the substrate temperature T. Cooling may be performed with helium, neon, argon, or the like introduced into the fifth treatment chamber 3250. Note that it is preferable that water, hydrogen, or the like be not included in nitrogen or a rare gas such as helium, neon, or argon which is used for the cooling. The purity of nitrogen or a rare gas such as helium, neon, or argon is preferably 6N (99.9999%) or more, more preferably, 7N (99.99999%) or more (that is, the impurity concentration is 1 ppm or less, preferably, 0.1 ppm or less).

With use of a deposition apparatus to which an evacuation unit such as a cryopump is applied, impurities in a treatment chamber can be reduced. Impurities attached to the inner wall of the treatment chamber are eliminated, and incorporation of impurities into a substrate during deposition and a film can be reduced. In addition, impurities which are eliminated from an atmosphere during preheating are evacuated, whereby the impurities can be prevented from being attached to the substrate again.

The oxide insulating layer formed with use of the deposition apparatus described in this embodiment contains a large number of dangling bonds. By forming the oxide insulating layer with use of the deposition apparatus to be in contact with the oxide semiconductor layer, impurities contained in the oxide semiconductor layer, specifically, a hydrogen atom and a compound containing a hydrogen atom such as $H_2O$ diffuse into or move to the oxide insulating layer from the oxide semiconductor layer. As a result, the impurity concentration in the oxide semiconductor layer can be reduced. In the oxide semiconductor layer in which the impurity concentration is reduced, an increase in carrier concentration due to an impurity is suppressed.

For example, in a thin film transistor in which an oxide semiconductor layer serving as a channel formation region is in contact with an oxide insulating layer formed with use of a deposition apparatus described in this embodiment, the carrier concentration in the channel formation region is reduced in the state where voltage is not applied to a gate electrode, i.e., in the off state; therefore, the thin film transistor has low off current and has favorable characteristics.

Further, it is possible to reduce a degree of shift of the threshold voltage when BT stress testing (bias-temperature stress testing) is performed, and a highly reliable thin film transistor can be provided.

A structure in which three or more treatment chambers are connected through a transfer chamber is employed in this embodiment; however, there is no limitation to this structure. For example, a so-called in-line structure may be employed in which the entrance and the exit for the substrate are provided and the treatment chambers are connected to each other.

This embodiment can be combined with any of the other embodiments in this specification as appropriate.

EXAMPLE 1

In Example 1, an analysis result of distribution of hydrogen concentration in the thickness direction of a stack structure in which an oxide semiconductor layer is interposed between insulating layers is described with reference to FIGS. 6A and 6B.

Figure 6A:
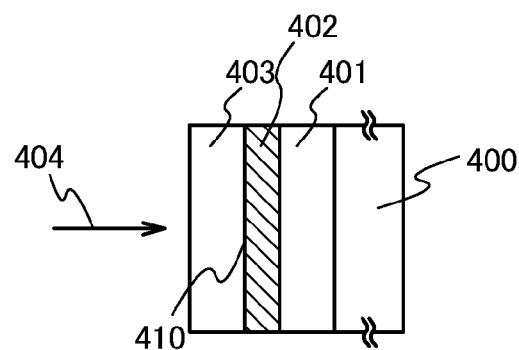
FIGS. 6A and 6B show results of SIMS analysis according to Example 1.

FIG. 6A is a schematic view illustrating a cross-sectional structure of a sample used in this analysis. The sample was formed in accordance with the manufacturing method described in Embodiment 1. An oxynitride insulating layer 401 was formed by a plasma CVD method over a glass substrate 400, an In—Ga—Zn—O-based oxide semiconductor layer 402 was formed over the oxynitride insulating layer 401, and a silicon oxide insulating layer 403 was formed by a sputtering method over the oxide semiconductor layer 402.

The distribution of hydrogen concentration in this sample was analyzed by secondary ion mass spectrometry (SIMS). FIG. 6B shows a SIMS analysis result of distribution of hydrogen concentration in the thickness direction of this sample. The horizontal axis represents the depth from the surface of the sample, and a depth of 0 nm at the left end corresponds to the surface of the sample (the silicon oxide insulating layer 403). An analysis direction 404 in FIG. 6A shows the direction in which the SIMS analysis was performed. The analysis was performed in the direction from the silicon oxide insulating layer 403 toward the glass substrate 400. That is, the analysis was performed in the direction from the left end of the horizontal axis of FIG. 6B to the right end thereof.

Figure 6B:
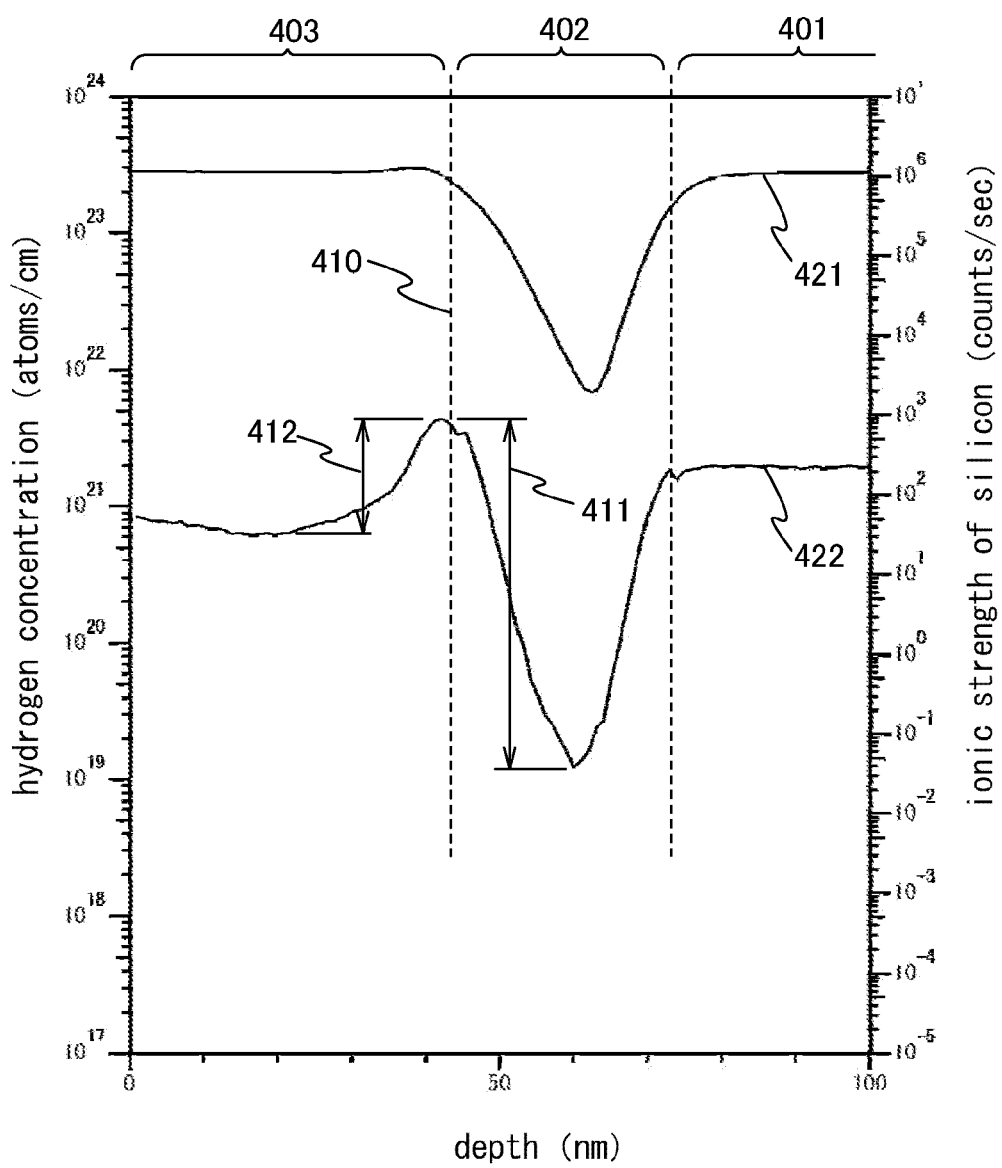

The vertical axes of FIG. 6B are logarithmic axes representing hydrogen concentration and ionic strength of silicon at a certain depth of the sample. In FIG. 6B, a hydrogen concentration profile 422 shows a hydrogen concentration profile in the sample. A silicon ionic strength profile 421 shows the ionic strength of silicon which was obtained in measurement of the hydrogen concentration profile 422. From the change in the silicon ionic strength profile 421, it is found that a region where the depth is 0 nm to 44 nm in FIG. 6B corresponds to the silicon oxide insulating layer 403, a region where the depth is 44 nm to 73 nm corresponds to the oxide semiconductor layer 402, and a region where the depth is 73 nm or more corresponds to the oxynitride insulating layer 401.

The hydrogen concentration in the oxide semiconductor layer 402 was quantified by using a standard sample which was manufactured with the same oxide semiconductor as the sample, and the hydrogen concentration in the silicon oxide insulating layer 403 and the oxynitride insulating layer 401 was quantified by using a standard sample which was manufactured with silicon oxide.

From the hydrogen concentration profile 422, it is found that the hydrogen concentration in the silicon oxide insulating layer 403 is approximately $7 \times 10^{20}$ atoms/cm$^3$. It is also found that the hydrogen concentration in the oxide semiconductor layer 402 is approximately $1 \times 10^{19}$ atoms/cm$^3$ or higher. It is also found that the hydrogen concentration in the oxynitride insulating layer 401 is approximately $2 \times 10^{21}$ atoms/cm$^3$. Further, in the vicinity of an interface 410 between the silicon oxide insulating layer 403 and the oxide semiconductor layer 402, a hydrogen concentration peak of approximately $4 \times 10^{21}$ atoms/cm$^3$ exists.

The hydrogen concentration peak is approximately 100 times as high as the hydrogen concentration in the oxide semiconductor layer 402 (the ratio is referred to as a hydrogen concentration ratio 411), and the hydrogen concentration peak is 5 times to 6 times as high as the hydrogen concentration in the silicon oxide insulating layer 403 (the ratio is referred to as a hydrogen concentration ratio 412). Note that as shown in Example 2 below, the silicon oxide insulating layer containing defects has a larger binding energy of a hydrogen atom than the oxide semiconductor layer; therefore, hydrogen in the oxide semiconductor layer 402 moves to the silicon oxide insulating layer 403 and gathers around the interface 410. On the other hand, the amount of hydrogen included in the oxide semiconductor layer 402 is controlled in a step of deposition. Therefore, there is upper limitation on the concentration of hydrogen which gathers around the interface 410, and it can be considered that the hydrogen concentration of the interface 410 is at least 5 times to 10 times as high as that of the silicon oxide insulating layer 403.

This is considered to be because hydrogen in the oxide semiconductor layer 402 gathered around the interface 410 and then diffused into the silicon oxide layer 403. Therefore, by reducing the concentration of hydrogen which is originally present in the silicon oxide insulating layer 403, the hydrogen concentration peak in the vicinity of the interface 410 can be reduced and the hydrogen concentration in the oxide semiconductor layer 402 can be further reduced.

EXAMPLE 2

The TFT property of an amorphous IGZO TFT depends on the length of a gate. When the gate is approximately 10 μm or shorter, Vth is likely to shift to a negative value. By performing annealing at 150° C. for 10 hours as a solution, the shift can be suppressed. As a result of annealing, hydrogen in the IGZO is considered to move into $SiO_2$. Calculation was performed to find which of the following is easy for a hydrogen atom to exist in: amorphous IGZO and amorphous SiOx.

A binding energy of a hydrogen atom E_bind was defined as follows, so that stability of the hydrogen atom in an environment was evaluated.

$$E\_bind = \{E(\text{original structure}) + E(H)\} - E(\text{structure with } H)$$

The larger this binding energy E_bind becomes, the more likely the hydrogen atom is to exist. E(original structure), E(H), and E(structure with H) respectively represent energy of the original structure, energy of the hydrogen atom, and energy of the structure with hydrogen. The binding energy of four samples was calculated: amorphous IGZO, amorphous $SiO_2$ without dangling bonds (hereinafter abbreviated to DB), and two kinds of amorphous SiOx with DB.

For calculation, CASTEP, which is a program for a density functional theory, was used. As a method for the density functional theory, a plan wave basis pseudopotential method was used. As a functional, LDA was used. Cut-off energy was 300 eV. K-point was a grid of 2×2×2.

The calculated structures are described below. First, the original structure is described. A unit cell of amorphous IGZO includes 84 atoms in total: 12 In atoms, 12 Ga atoms, 12 Zn atoms, and 48 O atoms. A unit cell of amorphous $SiO_2$ without DB includes 48 atoms in total: 16 Si atoms and 32 O atoms. Amorphous SiOx with DB (1) has such a structure that an O atom is removed from the amorphous $SiO_2$ without DB and one atom of Si which has been bonded to the O atom is bonded to a H atom; that is, it includes 48 atoms in total: 16 Si atoms, 31 O atoms, and 1 H atom. Amorphous SiOx with DB (2) has such a structure that a Si atom is removed from the amorphous $SiO_2$ without DB and three atoms of O which have been bonded to the Si atom are bonded to H atoms; that is, it includes 50 atoms in total: 15 Si atoms, 32 O atoms, and 3 H atoms. The structure with H is a structure in which H was attached to each of the above four structures. Note that H was attached to an O atom in the amorphous IGZO, a Si atom in the amorphous $SiO_2$ without DB, and an atom that has DB in the amorphous SiOx with DB. The structure in which H was calculated includes 1 H atom in a unit cell. Note that the cell size of each structure is shown in Table 1.

TABLE 1

| Structure | Cell Size (nm) Angle |
|---|---|
| Amorphous IGZO | 1.0197 × 1.0197 × 1.0197 $\alpha = \beta = \gamma = 90°$ |
| Amorphous $SiO_2$ without DB Amorphous SiOx with DB (1) Amorphous SiOx with DB (2) | 0.9127 × 0.9127 × 0.9127 $\alpha = \beta = \gamma = 90°$ |
| Hydrogen Atom | 1.0000 × 1.0000 × 1.0000 $\alpha = \beta = \gamma = 90°$ |

Calculation results are shown in Table 2.

TABLE 2

| | Energy of Structure with H (eV) | Energy of Original Structure (eV) | Energy of Hydrogen Atom (eV) | Binding Energy (eV) |
|---|---|---|---|---|
| Amorphous IGZO | −84951.3359 | −84935.6442 | −13.0015 | 2.69 |
| Amorphous $SiO_2$ without DB | −15783.8101 | −15770.6279 | −13.0015 | 0.18 |
| Amorphous SiOx with DB (2) | −15722.2053 | −15702.5905 | −13.0015 | 6.61 |
| Amorphous SiOx with DB (1) | −15363.1459 | −15345.6884 | −13.0015 | 4.46 |

From the above, amorphous SiOx in which oxygen has DB has the maximum binding energy, followed by amorphous SiOx in Si has DB, amorphous IGZO, and amorphous $SiO_2$ without DB having the minimum binding energy. Therefore, hydrogen becomes the most stable when being bonded to DB in amorphous SiOx.

As a result, the following process is expected. There is a large amount of DB in amorphous SiOx. A hydrogen atom diffusing at the interface between amorphous IGZO and amorphous SiOx becomes stable by being bonded to the DB in the amorphous SiOx. Thus, the hydrogen atom in the amorphous IGZO moves to the DB in the amorphous SiOx.

This application is based on Japanese Patent Application serial no. 2009-219558 filed with Japan Patent Office on Sep. 24, 2009, the entire contents of which are hereby incorporated by reference.

EXPLANATION OF REFERENCE

100: substrate, 102: gate insulating layer, 102a: gate insulating layer, 102b: gate insulating layer, 103: oxide semiconductor layer, 107: oxide insulating layer, 108: protective insulating layer, 111a: gate electrode, 111b: gate wiring layer, 113: oxide semiconductor layer, 115b: wiring layer, 123: oxide semiconductor layer, 128: contact hole, 151: thin film transistor, 401: oxynitride insulating layer, 402: oxide semiconductor layer, 403: silicon oxide insulating layer, 410: interface, 411: hydrogen concentration ratio, 412: hydrogen concentration ratio, 421: silicon ionic strength profile, 422: hydrogen concentration profile, 1000: apparatus for successive deposition, 1100: transfer chamber, 1101: transfer unit, 1110: load chamber, 1111: cassette, 1120: unload chamber, 1121: cassette, 1200: transfer chamber, 1201: transfer unit, 1205: evacuation unit, 1210: treatment chamber, 1211: substrate-heating unit, 1215: evacuation unit, 1220: treatment chamber, 1225: evacuation unit, 1230: treatment chamber, 1235: evacuation unit, 1240: treatment chamber, 1245: evacuation unit, 2000: apparatus for successive deposition, 2100: transfer chamber, 2101: transfer unit, 2110: load chamber, 2111: cassette, 2120: unload chamber, 2121: cassette, 2200: transfer chamber, 2201: transfer unit, 2205: evacuation unit, 2210: treatment chamber, 2215: evacuation unit, 2220: treatment chamber, 2221: substrate-heating unit, 2225: evacuation unit, 2230: treatment chamber, 2235: evacuation unit, 2240: treatment chamber, 2241: cooling unit, 2245: evacuation unit, 3000: apparatus for successive deposition, 3100: transfer chamber, 3101: transfer unit, 3105: evacuation unit, 3110: load chamber, 3111: cassette, 3115: evacuation unit, 3120: unload chamber, 3121: cassette, 3125: evacuation unit, 3210: treatment chamber, 3211: substrate-heating unit, 3215: evacuation unit, 3220: treatment chamber, 3225: evacuation unit, 3230: treatment chamber, 3235: evacuation unit, 3240: treatment chamber, 3241: substrate-heating unit, 3245: evacuation unit, 3250: treatment chamber, 3251: cooling unit, 3255: evacuation unit.

The invention claimed is:

1. A method for manufacturing a semiconductor element comprising the steps of:
   forming a gate electrode over a substrate;
   forming a gate insulating layer over the gate electrode;
   performing a first heat treatment on the substrate at a temperature lower than or equal to 600° C. after forming the gate insulating layer;
   forming an oxide semiconductor layer over the gate insulating layer by a sputtering method using a target and a pulse direct-current power supply while the substrate is heated at a temperature higher than or equal to 100° C. and lower than or equal to 600° C., wherein a relative density of the target is more than or equal to 90% and less than or equal to 100%; and
   forming an oxide insulating layer over the oxide semiconductor layer, wherein a part of the oxide insulating layer is in contact with the oxide semiconductor layer, and
   wherein a hydrogen concentration peak exists in an interface between the oxide semiconductor layer and the part of the oxide insulating layer.

2. The method for manufacturing a semiconductor element according to claim 1, further comprising the step of forming a source electrode and a drain electrode so as to be electrically connected to the oxide semiconductor layer.

3. The method for manufacturing a semiconductor element according to claim 1, further comprising the step of performing a second heat treatment on the substrate at a temperature lower than or equal to 750° C. after forming the oxide semiconductor layer.

4. The method for manufacturing a semiconductor element according to claim 1, further comprising the step of forming a protective insulating layer over the oxide insulating layer,
   wherein the protective insulating layer contains nitrogen.

5. The method for manufacturing a semiconductor element according to claim 1, wherein the oxide semiconductor layer contains indium, gallium, and zinc.

6. The method for manufacturing a semiconductor element according to claim 1, wherein a hydrogen concentration in the part of the oxide semiconductor layer is more than or equal to $1\times10^{18}$ cm$^{-3}$ and less than or equal to $2\times10^{20}$ cm$^{-3}$.

7. The method for manufacturing a semiconductor element according to claim 1, wherein the oxide insulating layer is formed by a sputtering method using a silicon target.

8. The method for manufacturing a semiconductor element according to claim 1, wherein the oxide semiconductor layer is formed without being exposed to air after performing the first heat treatment.

9. A method for manufacturing a semiconductor element comprising the steps of:
   forming a gate electrode over a substrate;
   forming a first wiring over the substrate;
   forming a first insulating layer over the gate electrode and the first wiring;
   performing a first heat treatment on the substrate at a temperature lower than or equal to 600° C. after forming the first insulating layer;
   forming an oxide semiconductor layer over the first insulating layer by a sputtering method using a target and a pulse direct-current power supply while the substrate is heated at a temperature higher than or equal to 100° C. and lower than or equal to 600° C., wherein a relative density of the target is more than or equal to 90% and less than or equal to 100%;
   forming a source electrode and a drain electrode over the oxide semiconductor layer, wherein the source electrode and the drain electrode are electrically connected to the oxide semiconductor layer;
   forming a second wiring over the first insulating layer, wherein the second wiring is electrically connected to the first wiring through an opening portion in the first insulating layer; and
   forming a second insulating layer over the oxide semiconductor layer, wherein at least a part of the second insulating layer is in contact with the oxide semiconductor layer,
   wherein the gate electrode and the first wiring are formed at the same time,
   wherein the source electrode, the drain electrode, and the second wiring are formed at the same time, and
   wherein a hydrogen concentration peak exists in an interface between the oxide semiconductor layer and the part of the second insulating layer.

10. The method for manufacturing a semiconductor element according to claim 9, further comprising the step of performing a second heat treatment on the substrate at a temperature lower than or equal to 750° C. after forming the oxide semiconductor layer.

11. The method for manufacturing a semiconductor element according to claim 9, further comprising the step of forming a third insulating layer over the second insulating layer,
   wherein the third insulating layer contains nitrogen.

12. The method for manufacturing a semiconductor element according to claim 9, wherein the oxide semiconductor layer contains indium, gallium, and zinc.

13. The method for manufacturing a semiconductor element according to claim 9, wherein a hydrogen concentration in the part of the oxide semiconductor layer is more than or equal to $1\times10^{18}$ cm$^{-3}$ and less than or equal to $2\times10^{20}$ cm$^{-3}$.

14. The method for manufacturing a semiconductor element according to claim 9, wherein the second insulating layer is formed by a sputtering method using a silicon target.

15. The method for manufacturing a semiconductor element according to claim 9, wherein the oxide semiconductor layer is formed without being exposed to air after performing the first heat treatment.

* * * * *